United States Patent [19]

Lee

[11] Patent Number: 5,400,411

[45] Date of Patent: Mar. 21, 1995

[54] VOLUME/BALANCE CONTROL APPARATUS

[75] Inventor: Jeung-in Lee, Kyungki-do, Rep. of Korea

[73] Assignee: Samsung Electronics Co., Ltd., Suwon, Rep. of Korea

[21] Appl. No.: 94,447

[22] Filed: Jul. 21, 1993

[30] Foreign Application Priority Data

Jul. 21, 1992 [KR] Rep. of Korea ............... 1992-13001

[51] Int. Cl.⁶ ............................................. H03G 3/00
[52] U.S. Cl. ................................. 381/109; 381/104; 381/1
[58] Field of Search ................. 381/109, 107, 104, 86, 381/28, 1

[56] References Cited

U.S. PATENT DOCUMENTS 4,292,467 9/1981 Odlen et al. ..................... 381/1

Primary Examiner—Curtis Kuntz
Assistant Examiner—Mark D. Kelly
Attorney, Agent, or Firm—Charles R. Donohoe; Robert A. Westerlund, Jr.; Stephen R. Whitt

[57] ABSTRACT

A volume/balance control apparatus includes a plurality of resistance arrays which correspond to a plurality of channels, a volume operator and a balance operator which generate volume and balance signals according to user's operation, an operation signal synthesizing means for producing synthesized control signals pertinent to each channel by synthesizing the volume signal and balance signal, and a plurality of decoders for decoding the output from the operation signal synthesizing means and applying the result to a switching element included in each resistance array. The volume/balance control apparatus has only one resistance array per channel, thereby improving noise characteristics, and permits the independent operation of volume and balance controls, thereby enhancing user convenience.

27 Claims, 18 Drawing Sheets

VOLUME/BALANCE CONTROL APPARATUS

FIELD OF THE INVENTION

The present invention relates to a volume/balance control apparatus, and more particularly to a volume/balance control apparatus including resistance arrays in order to control the volume and balance of a multichannel audio system such as stereo audio system.

FIG. 1 is a block diagram of a conventional volume/balance control apparatus including resistance arrays. The conventional volume/balance control apparatus comprises a balance operator 149, a volume operator 150, decoders 147 and 148, a balance resistance array, a volume resistance array and buffers 145 and 146.

The balance resistance array includes an R-channel balance resistance array 161 and an L-channel balance resistance array 160, and the volume resistance array includes an R-channel volume resistance array 163 and an L-channel volume resistance array 162. Each of the resistance arrays 160–163 shown in FIG. 1 is made of a plurality of resistors and switching elements, only one of the switching elements included in each resistance array should be "on" while the others should be "off." This results in forming only one signal path from the signal input node to the signal output node of each resistance array. Balance operator 149 and volume operator 150 respectively generate a balance signal and volume signal, in accordance with user operation. The generated balance and volume signals are decoded into a plurality of balance control signals and a plurality of volume control signals by decoders 147 and 148, respectively. Each balance control signal is applied to one of the switching elements of L-channel balance resistance array 160, and one of the switching elements of R-channel balance resistance array 161. $SB_1 \sim SB_m$ of FIG. 1 represent balance control signals, and $SB_1$ is applied to the last switching element 126 of L-channel balance resistance array 160 and to the first switching element 127 of R-channel balance resistance array 161, and $SB_m$ is applied to the first switching element 121 of L-channel balance resistance array 160 and to the last switching array 132 of R-channel balance resistance array 161. Therefore, the balance control has a complementary relationship.

Each volume control signal is applied to one of switching elements of L-channel volume resistance array 162 and one of switching elements of R-channel volume resistance array 163. $SV_1 \sim SV_n$ of FIG. 1 represent volume control signals, with $SV_1$ being applied to the first switching element 133 of L-channel volume resistance array 162 and to the first switching element 139 of R-channel volume resistance array 163, and $SV_n$ being applied to the last switching element 138 of L-channel volume resistance array 162 and to the last switching array 144 of R-channel volume resistance array 163.

Such a volume/balance control apparatus has the advantage of accurate control, by which the balance is fixed during manual volume operation and the volume is fixed during manual balance operation. However, this apparatus includes separate resistance arrays, and their buffers create a long signal path which results in signal delay, to thereby degrade dynamic range, threshold, and signal-to-noise ratio. The long signal path also results in degradation of the audio signal in the neutral balance state.

FIG. 2 shows the volume control apparatus according to the prior art, comprising an L-channel volume operator 225, an R-channel volume operator 226, decoders 223 and 224, an L-channel volume resistance array 162, and an R-channel volume resistance array 163.

The volume control apparatus shown in the FIG. 2 is designed to control L-channel volume and R-channel volume separately. Contrary to the volume/balance control apparatus of FIG. 1, this apparatus has no balance operator or balance resistance arrays, which eliminates the need for buffers and shortens the signal path to thus solve the aforementioned problem of a signal delay.

However, the volume control apparatus shown in FIG. 2 is inconvenient in that both the L-channel volume operator 225 and R-channel volume operator 226 must be operated by a user, even when the operation of only one is desired.

SUMMARY OF THE INVENTION

Accordingly, it is an object of the present invention to provide a volume/balance control apparatus which can easily control the balance and volume of a multichannel audio system, such as stereo audio system, having only one resistance array in each channel.

To accomplish the above object, there is provided a volume/balance control apparatus for controlling volume and balance of signals of a plurality of channels, comprising:

a plurality of resistance arrays, each having a plurality of resistors and a plurality of switching elements which are switched selectively, and for receiving signals of the plurality of channels, respectively;

a balance operating means for producing a balance signal in accordance with a user's operation;

a volume operating means for producing a volume signal in accordance with user's operation;

an operation signal synthesizing means for receiving the balance signal and the volume signal and producing a plurality of synthesized control signals based on a predetermined relationship between the balance and volume; and a plurality of decoding means for decoding the plurality of synthesized control signals, respectively, and applying the decoded signals to the switching elements included in each resistance array.

The above objects and other advantages of the present invention will become more apparent by describing in detail a preferred embodiment thereof with reference to the attached drawings.

DETAILED DESCRIPTION OF THE INVENTION

Figure 1:
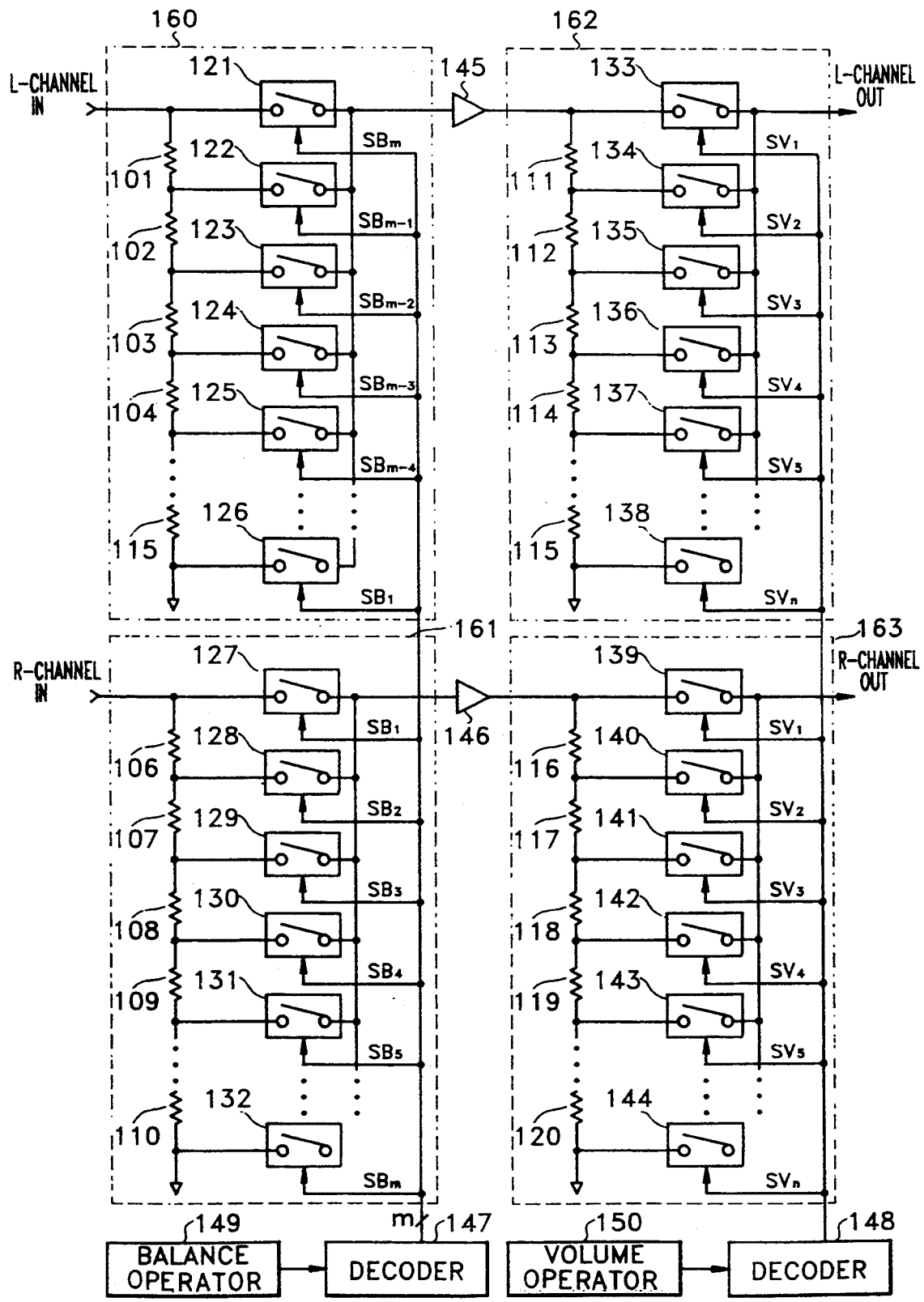
FIG. 1 is a block diagram of a volume/balance control apparatus according to the prior art.
Figure 2:
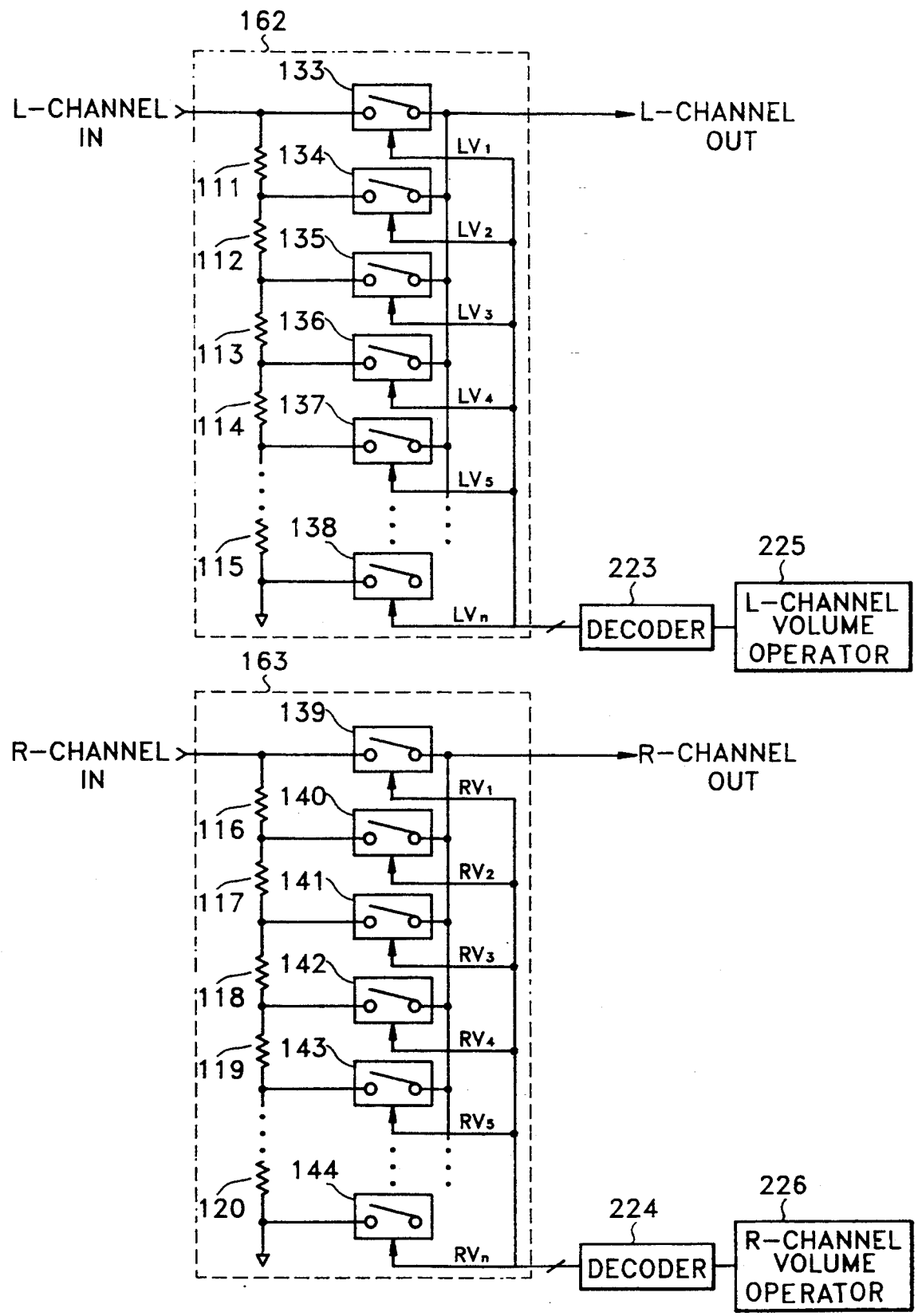
FIG. 2 is a block diagram of a volume control apparatus according to the prior art.
Figure 3:
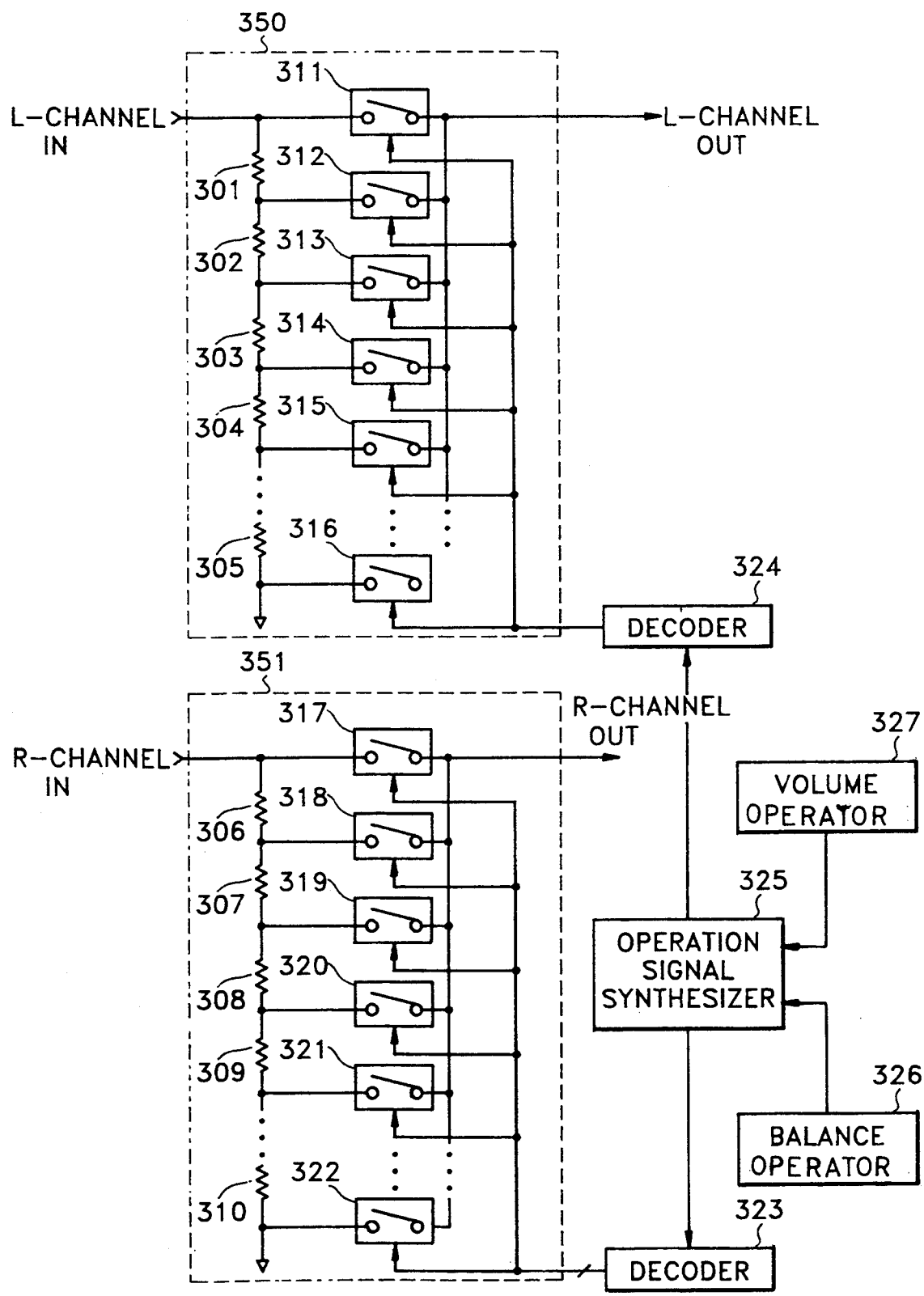
FIG. 3 is a block diagram of a volume/balance control apparatus according to one embodiment of the present invention.

FIG. 3 is a block diagram which shows an embodiment of the volume/balance control apparatus of the present invention. The volume/balance control apparatus includes an L-channel resistance array 350, an R-channel resistance array 351, a balance operator 326, a volume operator 327, an operation signal synthesizer 325 and two decoders 323 and 324.

In FIG. 3, R-channel resistance array 351 and L-channel resistance array 350 each include a plurality of resistors and switching elements. Each switching element of L-channel resistance array 350 and R-channel resistance array 351 performs switching selectively. Specifically, a plurality of a plurality resistor 301-305 included in L-channel resistance array 350 are connected in series between the L-channel input terminal and ground, and a plurality of switching elements 311-316 are respectively connected between the L-channel output terminal and one of the nodes, each node being formed by resistor 301-305. L-channel input terminal and ground. Only one of the thus-connected switching elements is selected at any given time, which is then selectively turned "on" so as to form a signal path via the selected switching element. Accordingly, the signal supplied to the L-channel input terminal is output with a signal level determined by the voltage divider network embodied by the series resistors 301-305, at the point of the selected switching element.

The constitution and operation of R-channel resistance array 351 is the same as L-channel resistance array 350.

Balance operator 326 produces the balance signal in accordance with the user's operation, while volume operator 327 produces the volume signal also in accordance with user's operation. Consequently, a user can operate the balance and the volume independently.

Operation signal synthesizer 325 receives the balance and volume signals from balance operator 326 and volume operator 327, respectively, and then produces an L-channel synthesized control signal and an R-channel synthesized control signal in accordance with a predetermined relationship between balance and volume. Here, the L-channel and R-channel synthesized control signals are representative of the switching elements of the corresponding L-channel or R-channel resistance array (350 or 351). That is, if the L-channel resistance array 350 and R-channel resistance array 351 each include 64 switching elements, the above L-channel synthesized control signal and R-channel synthesized control signal each become 6-bit data compositions indicating which of the 64 switching elements is "on" (selected). Thus, through decoder 324, the L-channel synthesized control signal output from operation signal synthesizer 325 is decoded into 64 switching signals, to be applied to each switching element of L-channel resistance array 350. Meanwhile, the R-channel synthesized control signal is decoded into 64 switching signals through decoder 323, and is applied to the switching elements of R-channel resistance array 351.

Generally, the relationship between the volume and the balance in operation signal synthesizer 325 is decided considering the overall factors in circuit design. In general, both the L-channel and R-channel synthesized control signals increase linearly according to the volume signal, while one decreases in proportion to the increase of the other according to the balance signal.

Additionally, FIG. 3 shows only the case of having two resistance arrays, but systems having three or more signal channels (e.g., Dolby and surround sound systems) can constitute a number of resistance arrays corresponding to the number of signal channels. A synthesized control signal for each channel is generated through operation signal synthesizer 325 after the functional relationship between volume and balance is defined. Thus, the generated synthesized control signals are applied to the respective switching element when decoding is completed by the corresponding decoder.

Here, operation signal synthesizer 325 can be realized by a microcomputer or logic circuits.

A typical example of the relationship of the volume and the balance in operation signal synthesizer 325 will be explained here using FIG. 4 through FIG. 9B.

First, to simplify explanation, we can assume that the balance signal (B) has a positive value when the signal level of the R-channel increases while that of the L-channel decreases, and that the horizontal axis represents the balance signal (B) while the vertical axis (C) represents the synthesized control signal of a given channel, i.e., the output of operation signal synthesizer 325. Here, if the balance signal B is zero, then the L- and R-channels are balanced. Accordingly, the point of intersection, whereat lines representing the values of the L-channel and R-channel synthesized control signals define the zero point of the balance signal. The zero point is positioned along the vertical axis at a level representing the volume signal (V), and indicates the synthesized control signal value of balanced L- and R-channels.

Figure 4:
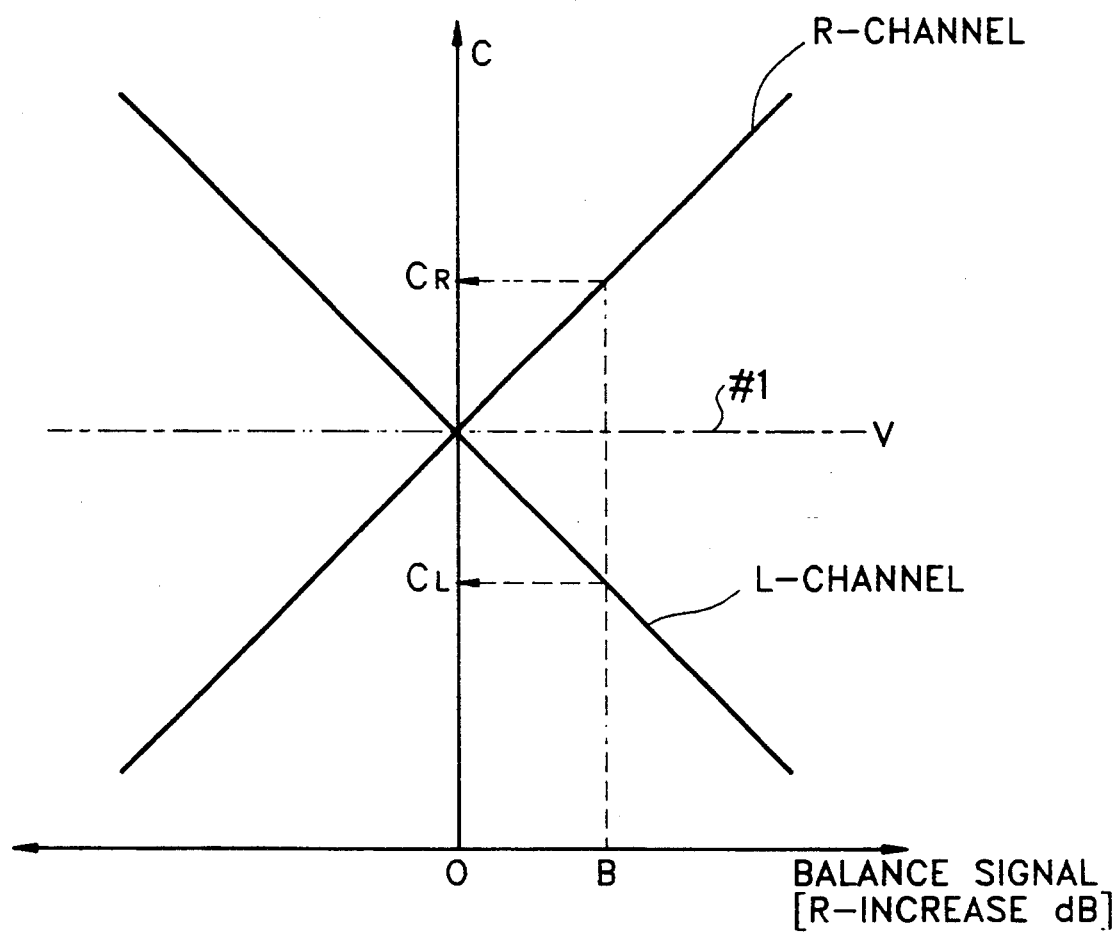
FIG. 4, 5A, 5B, 6A, 6B, 7, 8A, 8B, 9A and 9B are graphical representations for explaining the input/output relations of the operation signal synthesizer shown in FIG. 3.

In FIG. 4, lines representing the values of the L-channel and R-channel synthesized control signals are straight. Here, using the balance signal B and volume signal V, the L-channel synthesized control signal $C_L$ and R-channel synthesized control signal $C_R$ can be shown as follows:

$$C_R = a \cdot B + V \tag{1-1}$$

$$C_L = -a \cdot B + V \tag{1-2}$$

where $a$ is a predetermined coefficient which shows the slope of the line that represents an R-channel synthesized control signal on the graph.

Adding the L-channel synthesized control signal $C_L$ and the R-channel synthesized control signal $C_R$ relating to any point of balance signal produces a doubled volume signal value (2 V), which is the same value obtained by adding the L-channel synthesized control signal $C_L$ and the R-channel synthesized control signal $C_R$ relating to balanced point of balance signal. Here, the scales of the balance signal and the synthesized control signal are typically decibels (dB).

However, when the operation signal synthesizer 325 is realized for performing the function according to the relationship shown in FIG. 4, there are some problems in that the value which the L-channel synthesized control signal $C_L$ and R-channel synthesized control signal $C_R$ represents, will become larger than the numbers of the switching elements included in each resistance array or will become a negative value. To solve these overflow and underflow problems, the function which the above operation signal synthesizer 325 performs will be explained using FIGS. 5A and 6B.

Figure 5A:
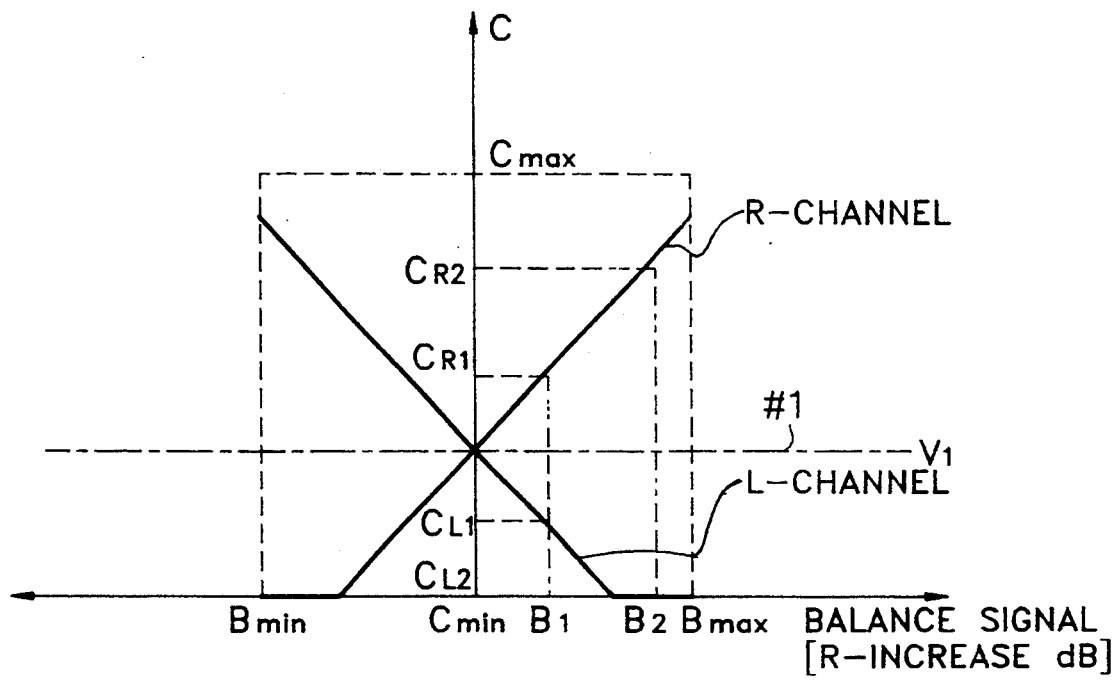
Figure 6A:
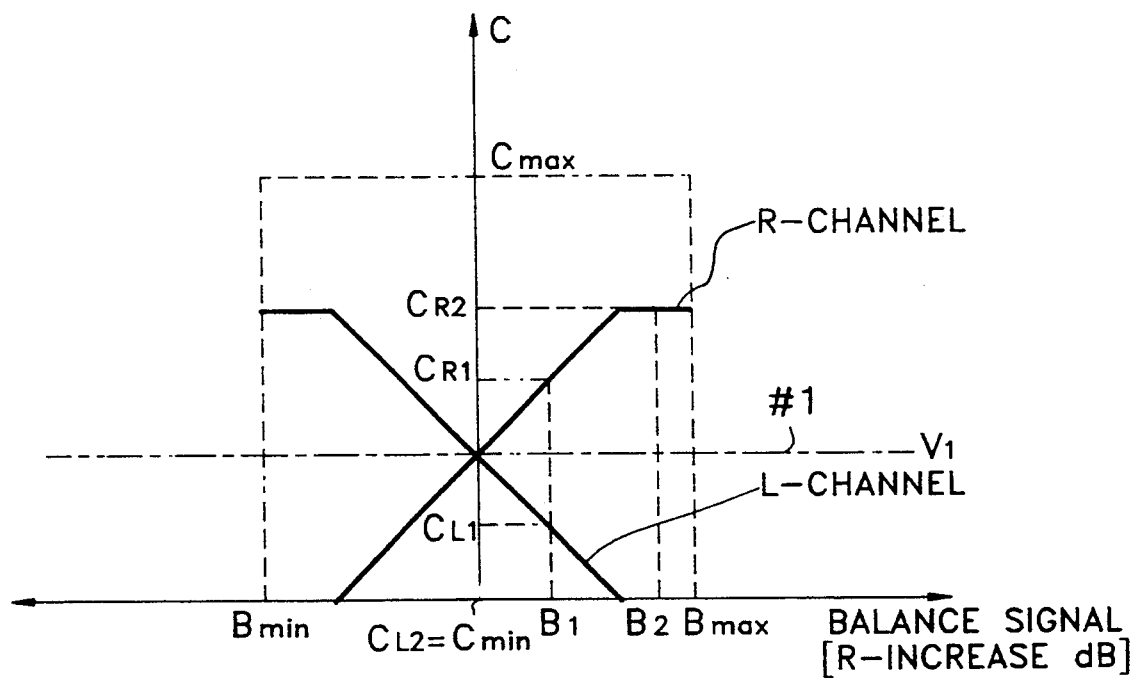
Figure 6B:
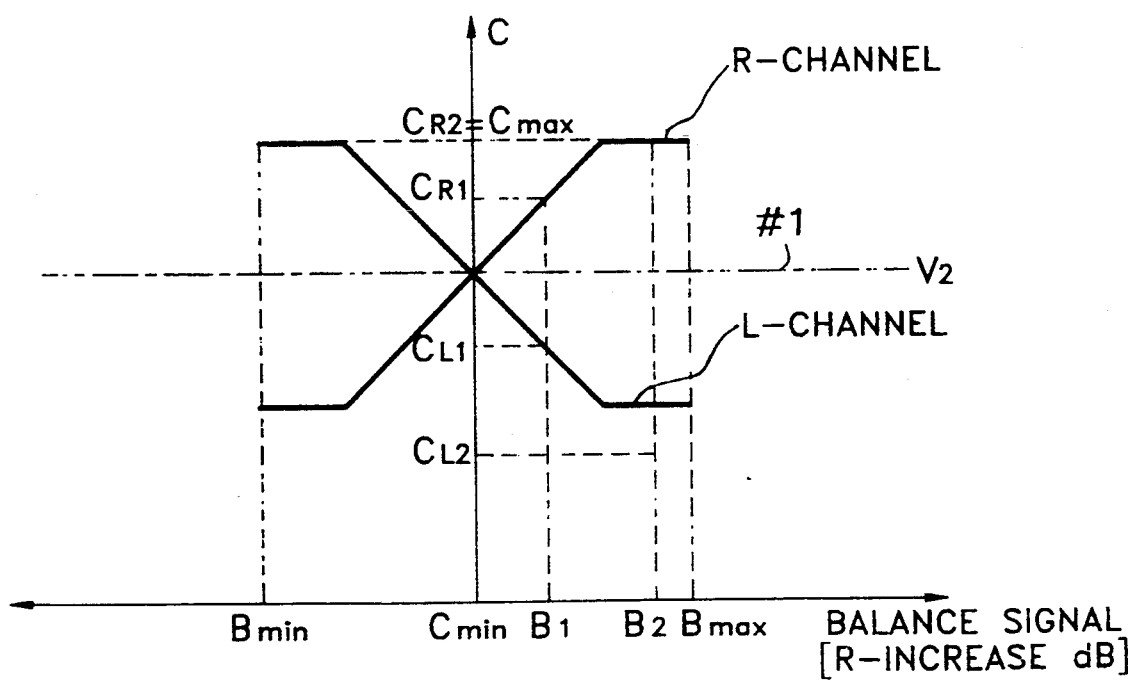

In FIGS. 5A and 6B, Bmax and Bmin are the maximum and minimum value that the balance signal B can have, while Cmax and Cmin are the maximum and minimum value which the synthesized control signals of each channel can have. Generally, Bmax and Bmin have the same absolute value, but with opposite signs, and Cmin is zero.

FIG. 5A illustrates a case in which an underflow exists. The underflow exists when the volume signal V is too low. In FIG. 5A, if the balance signal B has a value of $B_1$, R-channel synthesized control signal $C_R$ and L-channel synthesized control signal $C_L$ have the value of $C_{L1}$ and $C_{R1}$ respectively, which can be produced based on the above expressions 1-1 and 1-2. However, if the balance signal B has a value of $B_2$, R-channel synthesized control signal $C_R$ can be produced based on the above expression 1-1 while L-channel synthesized control signal $C_L$ does not have the value produced based on the above expression 1-2, but have the Cmin value (that is, zero).

Accordingly, the L-channel synthesized control signal is produced based on expression 1-2, then it is determined whether an underflow of the result exists, and if it does, the value is changed to Cmin. The same can be applied to the case of R-channel synthesized control signal $C_R$ generating underflow.

Figure 5B:
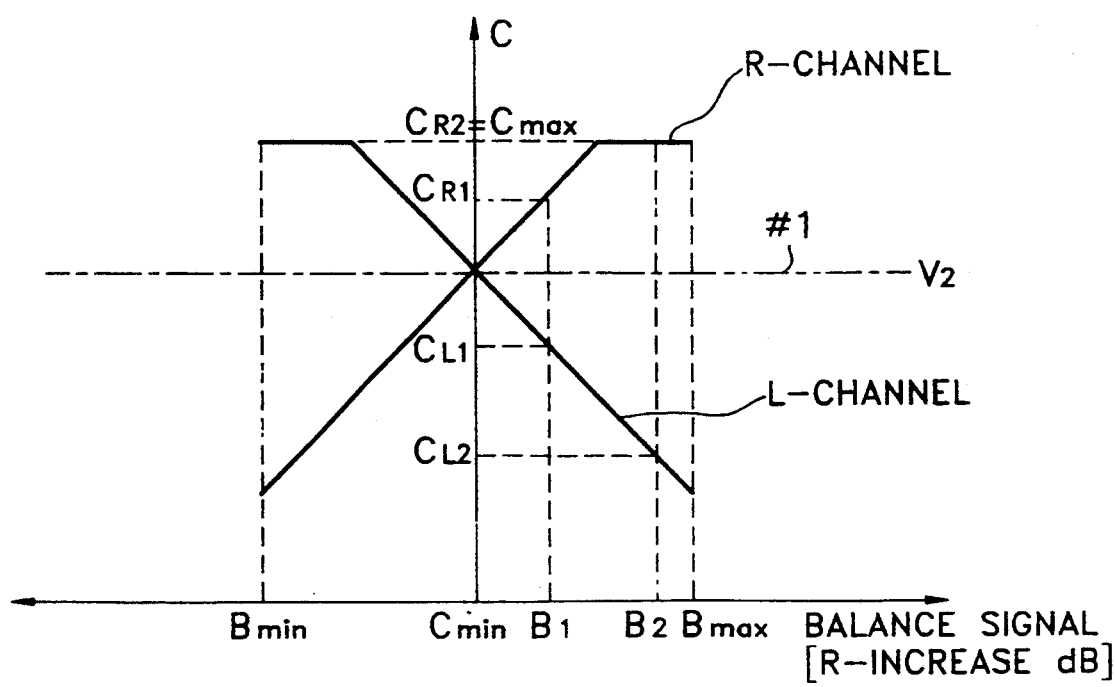

Meanwhile, FIG. 5B illustrates a case in which an overflow exists, and the overflow exists when the volume signal V is too high.

As in FIG. 5A, first, R-channel synthesized control signal $C_R$ and L-channel synthesized control signal $C_L$ are produced based on expressions 1-1 and 1-2. Then, the produced values is set to Cmax if the overflow thereof exists. What is illustrated in FIG. 5A and FIG. 5B can be shown by using a high-level program language as follows:

$$C_{R'} = a \cdot B + V$$

$$C_{L'} = -a \cdot B + V$$

IF $C_{R'} \geq$ Cmax, THEN $C_R =$ Cmax

IF $C_{R'} \leq$ Cmin, THEN $C_R =$ Cmin, ELSE $C_R = C_{R'}$

IF $C_{L'} \geq$ Cmax, THEN $C_L =$ Cmax

IF $C_{L'} \leq$ Cmin, THEN $C_L =$ Cmin, ELSE $C_L = C_{L'}$

FIGS. 6A and 6B show that the synthesized control signal values of other channels are designed to be converted if the overflow or underflow of one channel exists, differently from FIGS. 5A and 5B. To change the value of another channel in this manner is the same as doubling the sum of the synthesized control signal of each channel. What is illustrated in FIGS. 6A and 6B can be shown by using the high-level program language as follows:

$$C_{R'} = a \cdot B + V$$

$$C_{L'} = -a \cdot B + V$$

IF $C_{R'} \geq$ Cmax, THEN $C_R =$ Cmax, $C_L = 2V -$ Cmax

IF $C_{R'} \leq$ Cmin, THEN $C_R =$ Cmin, $C_L = 2V$

IF $C_{L'} \geq$ Cmax, THEN $C_L =$ Cmax, $C_R = 2V -$ Cmax

Figure 7:
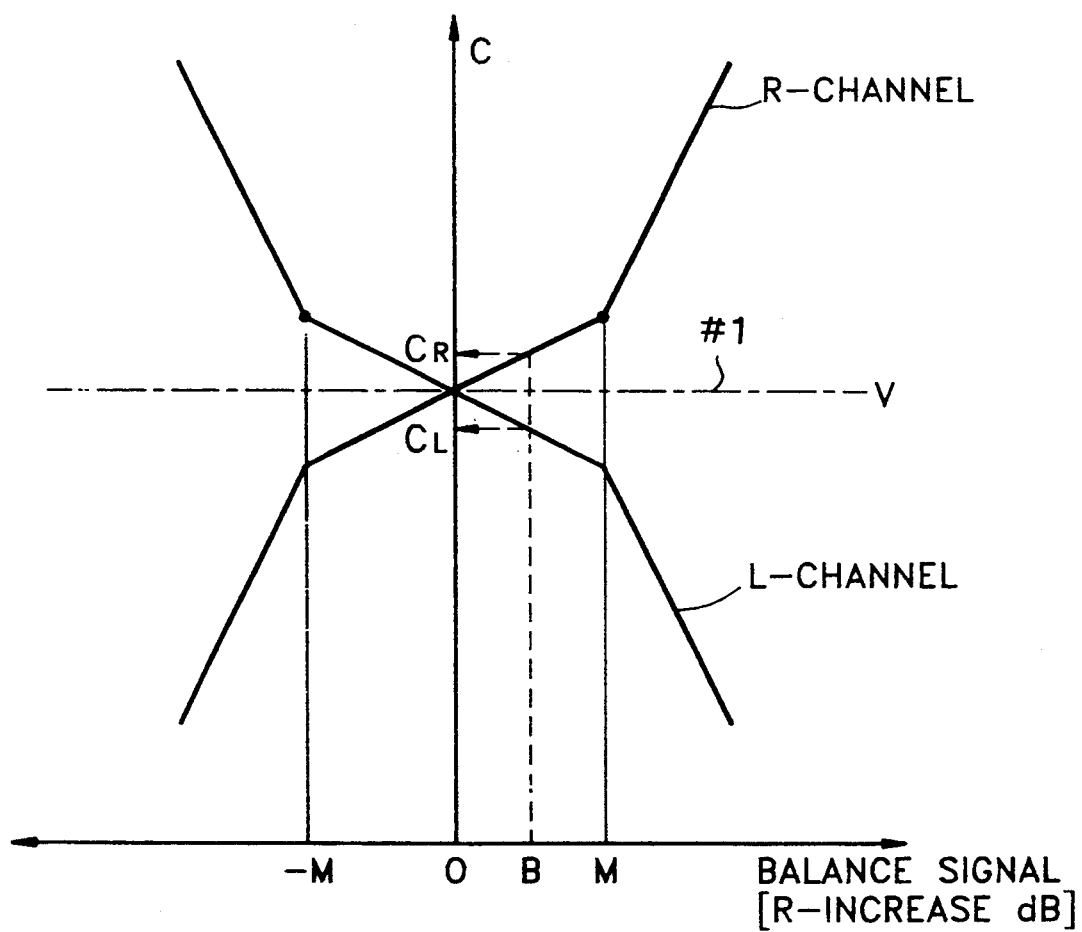
Figure 9A:
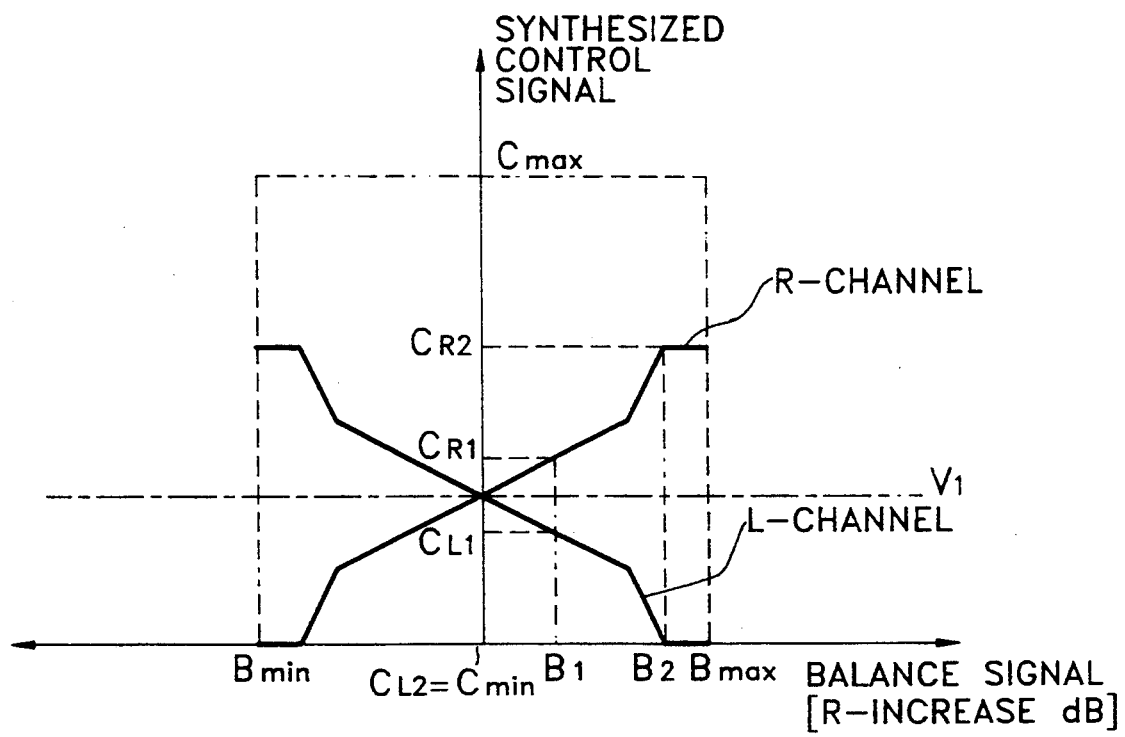
Figure 9B:
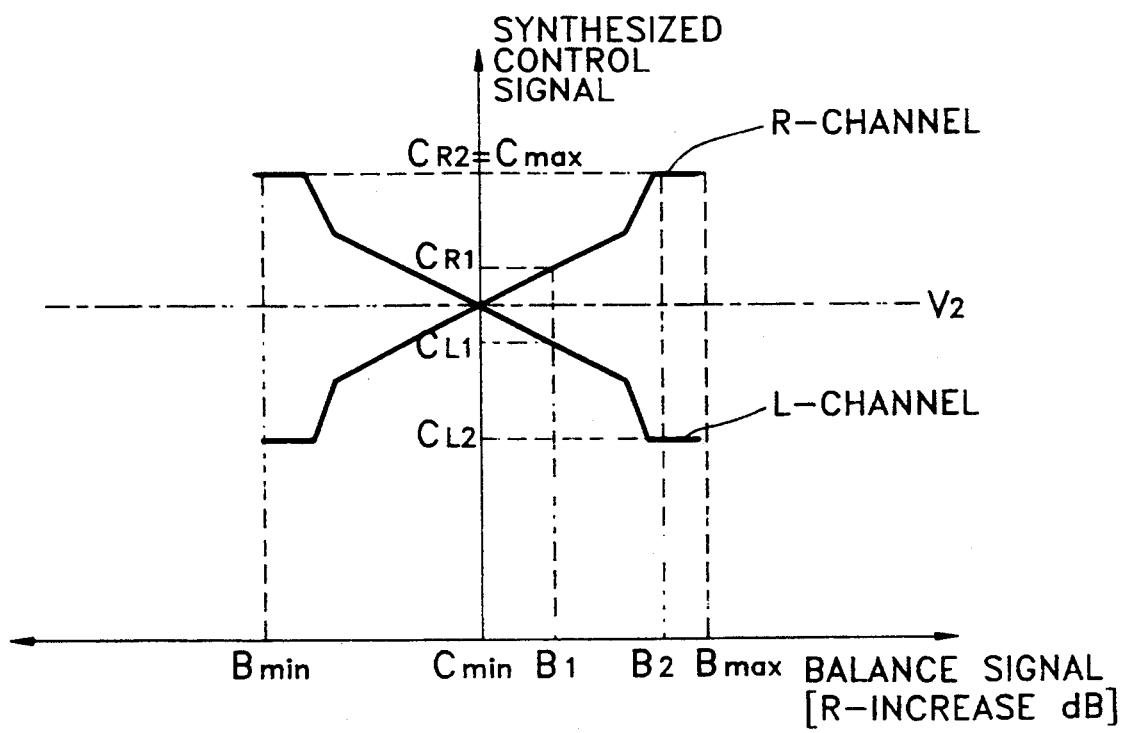

IF $C_{L'} \leq$ Cmin, THEN $C_L =$ Cmin, $C_R = 2V$, ELSE $C_R = C_{R'}$, $C_L = C_{L'}$ In FIG. 7 and FIG. 9B, lines representing the values which L-channel synthesized control signal and R-channel synthesized control signal, have multiple slopes according to the range of the balance signal B, differently from FIG. 4 and FIG. 5B.

Referring to FIG. 7, the line representing the values of the synthesized control signal $C_R$ is a straight line having a slope of $a1$, provided that the absolute value of the balance signal B is less than or equal to the predetermined boundary value M. Meanwhile, the lines representing the values of the synthesized control signal $C_R$ are straight lines having a slope of $a2$. The synthesized control signal $C_R$ has a continuity. The values of the L-channel synthesized control signal $C_L$ are symmetrically opposed to the R-channel synthesized control signal $C_L$ with respect to the straight line #1. Accordingly, R-channel synthesized control signal $C_R$ and L-channel synthesized control signal $C_L$ are produced based on one set of the following expressions, in accordance with the values of the balance signal B.

i) if $-M \leq B \leq M$ $$C_R = a1 \cdot B + V \tag{2-1}$$

$$C_L = -a1 \cdot B + V \tag{2-2}$$

or ii) if $B > M$ or $B < -M$ $$C_R = a2 \cdot (B-M) + a1 \cdot M + V \tag{2-3}$$

$$C_L = -\alpha2 \cdot (B-M) - \alpha1 \cdot M + V \qquad (2\text{-}4)$$

However, the steps for controlling the volume or balance have a volume-to-balance ratio of 1:1 or 2:1. Thus, the first coefficient α1 and the second coefficient α2 have values of "1" and "2," respectively. With these values for the first and second coefficients, the above expressions (2-1 through 2-4) can be converted as follows:

i) if $-M \leq B \leq M$ $$C_R = B + V \qquad (3\text{-}1)$$

$$C_L = -B + V \qquad (3\text{-}2)$$

ii) if $B > M$ or $B < -M$ $$C_R = 2B + M + V \qquad (3\text{-}3)$$

$$C_L = -2B - M + V \qquad (3\text{-}4)$$

Figure 8A:
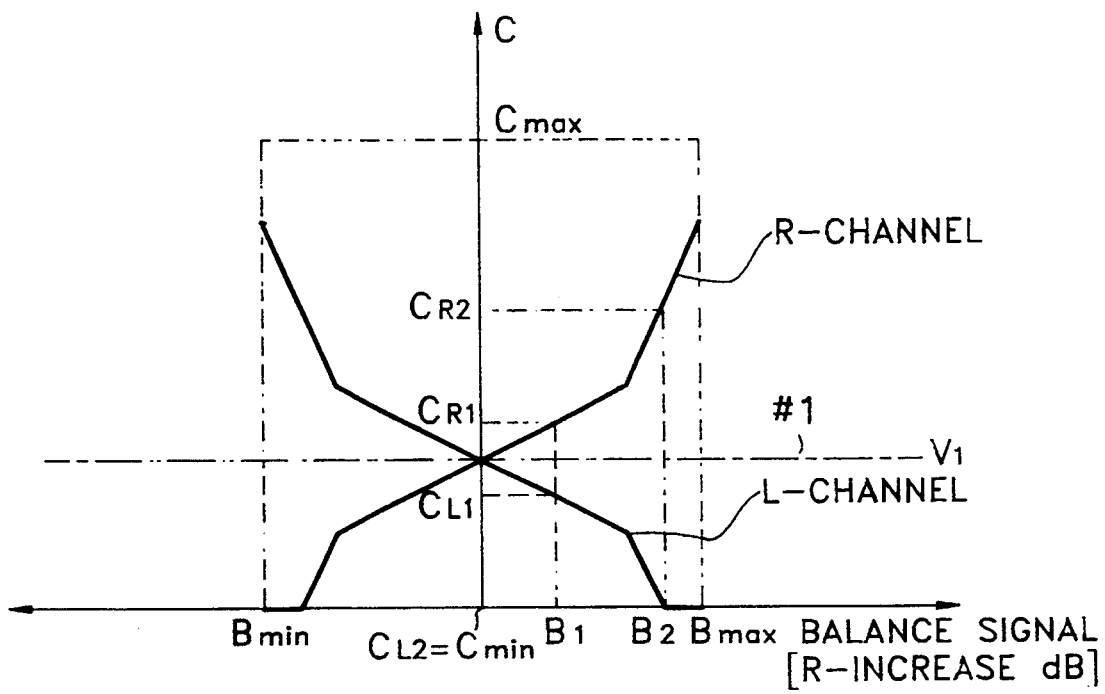
Figure 8B:
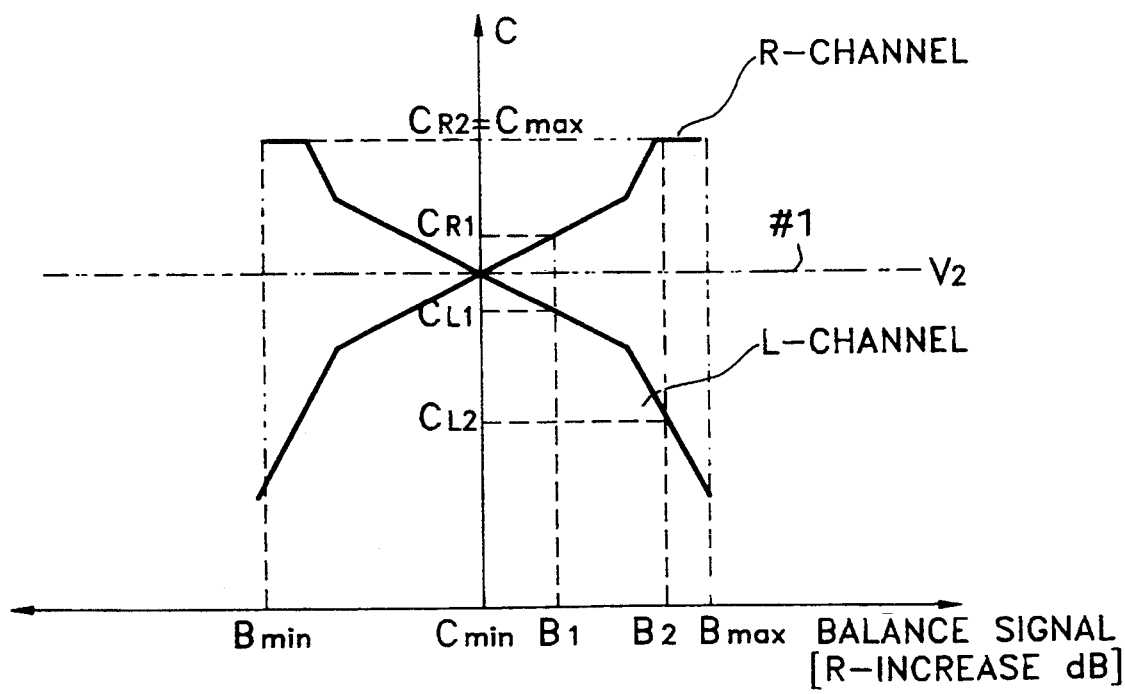

FIGS. 8A and 8B are graphical representations when the overflow or underflow is solved, using the same method explained in reference to FIGS. 5A and 5B, and these graphs can be expressed using high-level programming language as follows:

IF $(B \geq M).\text{AND}.(B \leq -M)$, THEN $C_{R'} = \alpha1 \cdot B + V$,
$C_{L'} = -\alpha1 \cdot B + V$ IF $(B > M).\text{OR}.(B < -M)$, THEN
$C_{R'} = \alpha2 \cdot (B-M) + \alpha1 \cdot M + V$,
$C_{L'} = -\alpha2 \cdot (B-M) - \alpha1 \cdot M + V$ IF $C_{R'} \geq \text{Cmax}$, THEN $C_R = \text{Cmax}$ IF $C_{R'} \leq \text{Cmin}$, THEN $C_R = \text{Cmin}$, ELSE $C_R = C_{R'}$ IF $C_{L'} \geq \text{Cmax}$, THEN $C_L = \text{Cmax}$ IF $C_{L'} \leq \text{Cmin}$, THEN $C_L = \text{Cmin}$, ELSE $C_L = C_{L'}$ This expression can be converted to the case to the first coefficient being "1" and the second coefficient being "2," as follows:

IF $(B \geq M).\text{AND}.(B \leq -M)$, THEN $C_{R'} = B + V$,
$C_{L'} = -B + V$ IF $(B > M).\text{OR}.(B < -M)$, THEN $C_{R'} = 2B + M + V$,
$C_{L'} = -2B - M + V$ IF $C_{R'} \geq \text{Cmax}$, THEN $C_R = \text{Cmax}$ IF $C_{R'} \leq \text{Cmin}$, THEN $C_R = \text{Cmin}$, ELSE $C_R = C_{R'}$ IF $C_{L'} \geq \text{Cmax}$, THEN $C_L = \text{Cmax}$ IF $C_{L'} \leq \text{Cmin}$, THEN $C_L = \text{Cmin}$, ELSE $C_L = C_{L'}$ FIGS. 9A and 9B are graphical representations when the overflow or underflow is solved, using the same method explained during reference to FIGS. 6A and 6B, and these can be expressed by using high-level programming language as follows:

IF $(B \geq M).\text{AND}.(B \leq -M)$, THEN $C_{R'} = \alpha1 \cdot B + V$,
$C_{L'} = -\alpha1 \cdot B + V$ IF $(B > M).\text{OR}.(B < -M)$, THEN
$C_{R'} = \alpha2 \cdot (B-M) + \alpha1 \cdot M + V$,
$C_{L'} = -\alpha2 \cdot (B-M) - \alpha1 \cdot M + V$ IF $C^R \geq \text{Cmax}$, THEN $C_R = \text{Cmax}$, $C_L = 2V - \text{Cmax}$ IF $C_{R'} \leq \text{Cmin}$, THEN $C_R = \text{Cmin}$, $C_L = 2V$ IF $C_{L'} \geq \text{Cmax}$, THEN $C_L = \text{Cmax}$, $C_R = 2V - \text{Cmax}$ IF $C_{L'} \leq \text{Cmin}$, THEN $C_L = \text{Cmin}$, $C_R = 2V$, ELSE
$C_R = C_{R'}$, $C_l = C_{L'}$ Here too, this expression can be converted into the case of the first coefficient being "1" and the second coefficient being "2," as follows:

IF $(B \geq M).\text{AND}.(B \leq -M)$, THEN $C_{R'} = B + V$,
$C_{L'} = -B + V$ IF $(B > M).\text{OR}.(B < -M)$, THEN $C_{R'} = 2B + M + V$,
$C_L = -2B - M + V$ IF $C_{R'} \geq \text{Cmax}$, THEN $C_R = \text{Cmax}$, $C_L = 2V - \text{Cmax}$ IF $C_{R'} \leq \text{Cmin}$, THEN $C_R = \text{Cmin}$, $C_L = 2V$ IF $C_{L'} \geq \text{Cmax}$, THEN $C_L = \text{Cmax}$, $C_R = 2V - \text{Cmax}$ IF $C_{L'} \leq \text{Cmin}$, THEN $C_L = \text{Cmin}$, $C_R = 2V$, ELSE
$C_R = C_{R'}$, $C_L = C_{L'}$ Now, the various embodiments of operation signal synthesizer 325 which can perform the above-explained functions will be explained with reference to FIGS. 10-20.

The operation signal synthesizer 325 varies slightly in hardware construction depending on the binary expression utilized for the above balance signal B. Here, let us assume that the balance signal B is made of a balance deviation signal b and a direction signal S. The direction signal S indicates whether the R-channel increases while the L-channel decreases (or vice versa), and the balance deviation signal b is the increasing or decreasing balance value, that is, the absolute value of the balance signal B.

Figure 10:
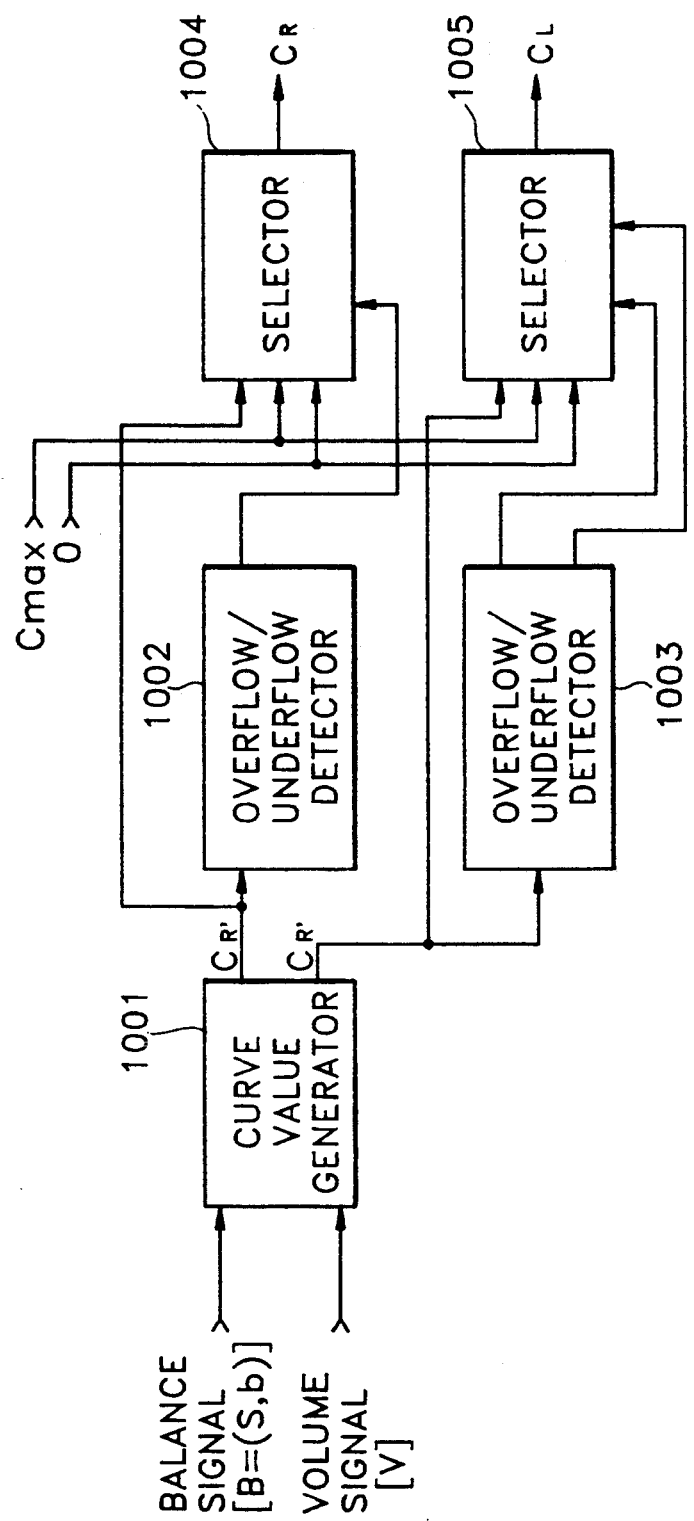
FIG. 10 is a block diagram of an embodiment of the operation signal synthesizer shown in FIG. 3, and more particularly, a block diagram of a control signal synthesizer whose input/output relations are explained by FIGS. 5A & 5B and FIGS. 8A & 8B.

FIG. 10 is a block diagram in accordance with the embodiment of the operation signal synthesizer shown in FIG. 3, and more particularly, a block diagram of an operation signal synthesizer whose input/output relations are explained by FIGS. 5A & 5B and FIGS. 8A & 8B. The operation signal synthesizer includes a curve value generator 1001, two overflow/underflow detectors 1002 and 1003. and two selectors 1004 and 1005. Curve value generator 1001 produces both R-channel curve value $C_{R'}$ and L-channel curve value $C_{L'}$ according to a predetermined relationship. Overflow/underflow detector 1002 detects whether an overflow/underflow exists in the R-channel curve value $C_{R'}$ applied from curve value generator 1001, and overflow/underflow detector 1003 detects whether an overflow/underflow exists in the L-channel curve value $C_{L'}$ applied from curve value generator 1001.

According to the output of overflow/underflow detector 1002, selector 1004 selects one among a predetermined maximum value Cmax, a predetermined minimum value Cmin and R-channel curve value $C_{R'}$ generated in curve value generator 1001, and then outputs the selected value as an R-channel synthesized control signal $C_R$. According to the output of overflow/underflow detector 1003, selector 1005 selects one among the predetermined maximum value Cmax, the predetermined minimum value Cmin and L-channel curve value $C_{L'}$ generated by curve value generator 1001, and then outputs the selected value as an L-channel synthesized control signal $C_L$.

Figure 11:
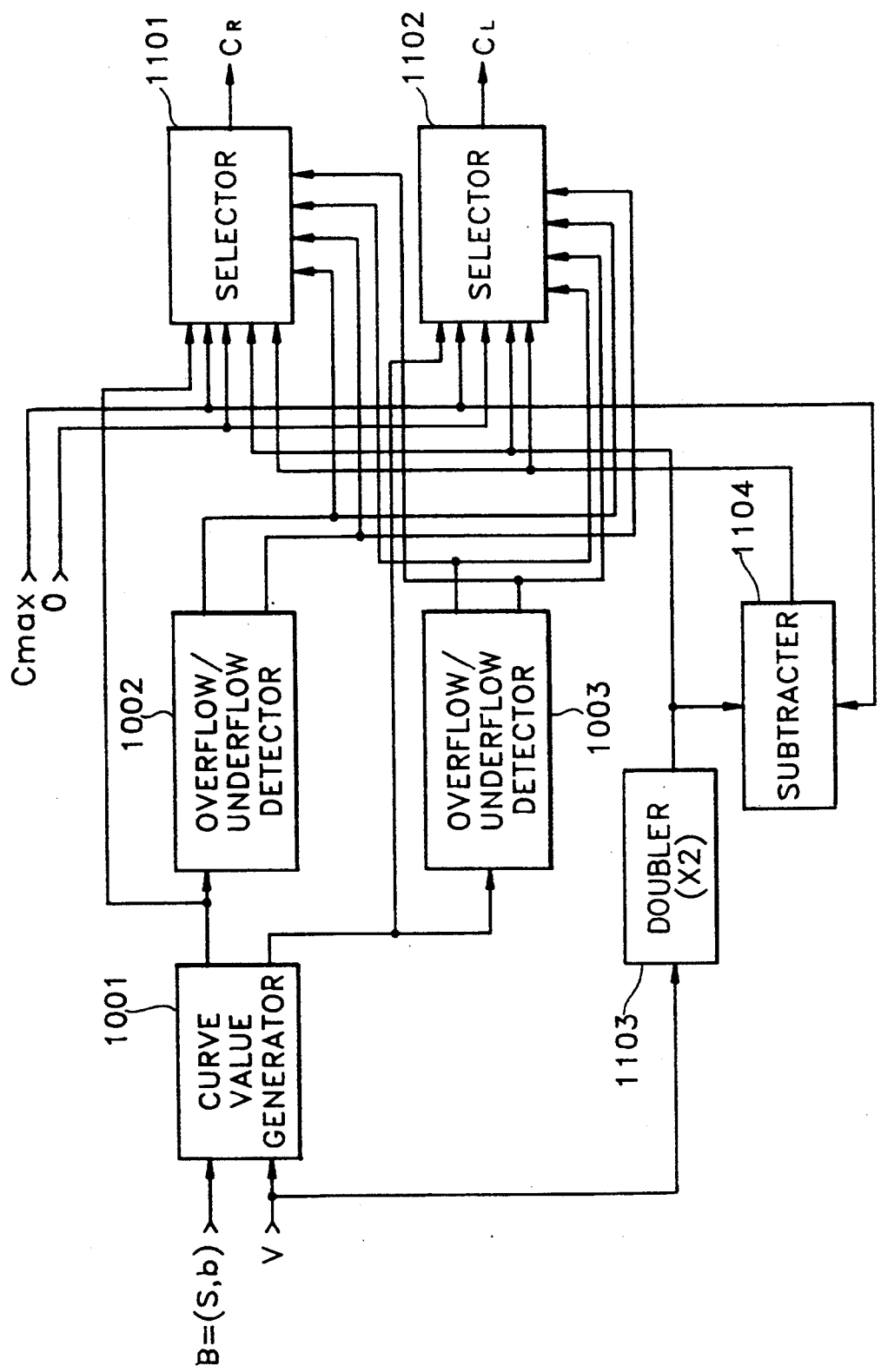
FIG. 11 is a block diagram of another embodiment of the operation signal synthesizer shown in FIG. 3, and more particularly, a block diagram of an operation signal synthesizer whose input/output relations are explained by FIGS. 6A & 6B and FIGS. 9A & 9B.

FIG. 11 is a block diagram of another embodiment of the operation signal synthesizer 325 shown in FIG. 3, and more particularly, a block diagram of an operation signal synthesizer whose input/output relations are explained by FIGS. 6A & 6B and FIGS. 9A & 9B. The operation signal synthesizer 325 includes a curve value generator 1001, two overflow/underflow detectors 1002 and 1003, two selectors 1101 and 1102, a doubler 1103, and a subtracter 1104.

Referring to FIG. 11, a curve value generator 1001, and overflow/underflow detectors 1002 and 1003 perform the same function explained in reference to FIG. 10. The doubler 1103 doubles volume signal V which is output from the volume operator 327, and produces this doubled volume signal. This can be done by the multiplier or by connecting a signal line in order to be applied to subtracter 1104, up-shifting by one bit. Subtracter 1104 subtracts maximum value Cmax from the output of doubler 1103, and produces the result.

Selector 1101 selects one among the maximum value Cmax, the above minimum value Cmin, the output of subtracter 1104, the output of doubler 1103, and R-channel curve value $C_{R'}$ which is generated from curve value generator 1001, in accordance with the outputs of overflow/underflow detectors 1002 and 1003. The selector 1101 then produces the selected one as an R-channel synthesized control signal $C_R$. In more detail, the maximum value Cmax is selected when the R-channel curve value $C_{R'}$ generates overflow. The minimum value Cmin is selected when R-channel curve value $C_{R'}$ generates underflow. The output of subtracter 1104 is selected when the L-channel curve value $C_{L'}$ generates overflow. The output of doubler 1103 is selected when the L-channel curve value $C_{L'}$ generates underflow. When neither the R-channel curve value $C_{R'}$ or the L-channel curve value $C_{L'}$ generate overflow or underflow, the R-channel curve value $C_{R'}$ which is output from the curve value generator 1001 is selected.

Selector 1102 performs almost the same functions as selector 1101. Selector 1102 selects one among the above maximum value Cmax, the above minimum value Cmin, the output of subtracter 1104, the output of doubler 1103, and R-channel curve value $C_{R'}$ which is generated from curve value generator 1001, in accordance with the outputs of the overflow/underflow detectors 1002 and 1003, and produces the selected value as a R-channel synthesized control signal. That is, the maximum value Cmax is selected when the L-channel curve value $C_{L'}$ generates overflow. The minimum value Cmin is selected when L-channel curve value $C_{L'}$ generates underflow. The output of subtracter 1104 is selected when the R-channel curve value $C_{R'}$ generates overflow. The output of doubler 1103 is selected when the R-channel curve value $C_{R'}$ generates underflow. When neither the R-channel curve value $C_{R'}$ or the L-channel curve value $C_{L'}$ generate overflow or underflow, the L-channel curve value $C_{L'}$ which is output from curve value generator 1001 is selected.

Figure 12:
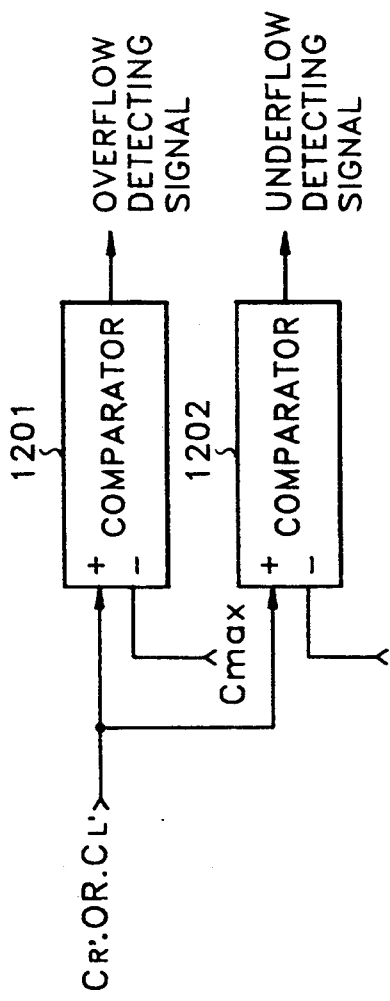
FIG. 12 is a detailed block diagram of an embodiment of each overfLow/underflow detector shown in FIG. 10 and FIG. 11.

FIG. 12 is a detailed block diagram of an embodiment of the overflow/underflow detector shown in FIG. 10 and FIG. 11, which includes two comparators 1201 and 1202.

Referring to FIG. 12, comparator 1201 produces an overflow detecting signal which is active when the curve value of each channel applied from curve value generator 1001 is larger than the above maximum value Cmax. Also, comparator 1202 outputs an underflow detecting signal which is active when the curve value of each channel from curve value generator 1001 is smaller than the above maximum value Cmin.

Figure 13:
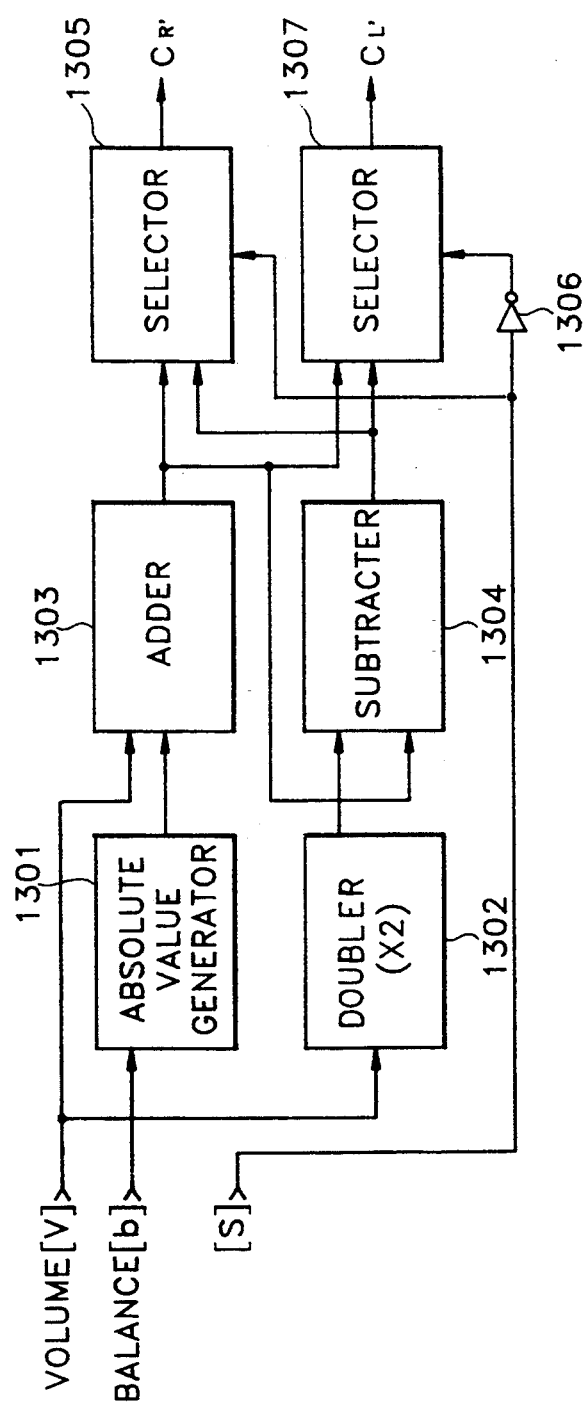
FIG. 13 is a block diagram of an embodiment of the curve value generator shown in FIG. 10 and FIG. 11.

FIG. 13 is a block diagram in accordance with an embodiment of the curve generator shown in FIG. 10 and FIG. 11. The curve generator includes an absolute value generator 1301, a doubler 1302, an adder 1303, a subtracter 1304, two selectors 1305 and 1307, and an inverter 1306.

Referring to FIG. 13, absolute value generator 1301 receives the balance deviation signal b and produces an absolute value A according to the predetermined relationship. For example, when the operation signal synthesizer 325 performs functions which can be explained by FIG. 4 or FIG. 6B, it produces an absolute value A according to the following expression:

$$A = \alpha \cdot B$$

Meanwhile, when control signal synthesizer 325 performs functions which are explained by FIG. 7 or FIG. 9B, it produces an absolute value A according to the following expression:

$$A = \alpha 2 \cdot (b - M) + \alpha 1 \cdot M$$

provided that $\alpha 1$ and $\alpha 2$ represent the slopes of straight lines shown in FIG. 7 through FIG. 9B.

Referring to FIG. 13 again, doubler 1302 produces the doubled volume signal V, and this output is applied to subtracter 1304. Adder 1303 adds the volume signal V to the output of absolute value generator 1301. Subtracter 1304 subtracts the output of adder 1303 from that of doubler 1302. Inverter 1306 inverts the direction signal S. Selector 1305 selects one between the output of adder 1303 and the output of subtracter 1304, according to the direction signal S. Selector 1307 selects one between the output of adder 1303 and the output of subtracter 1304, according to the output of inverter 1306.

Figure 14:
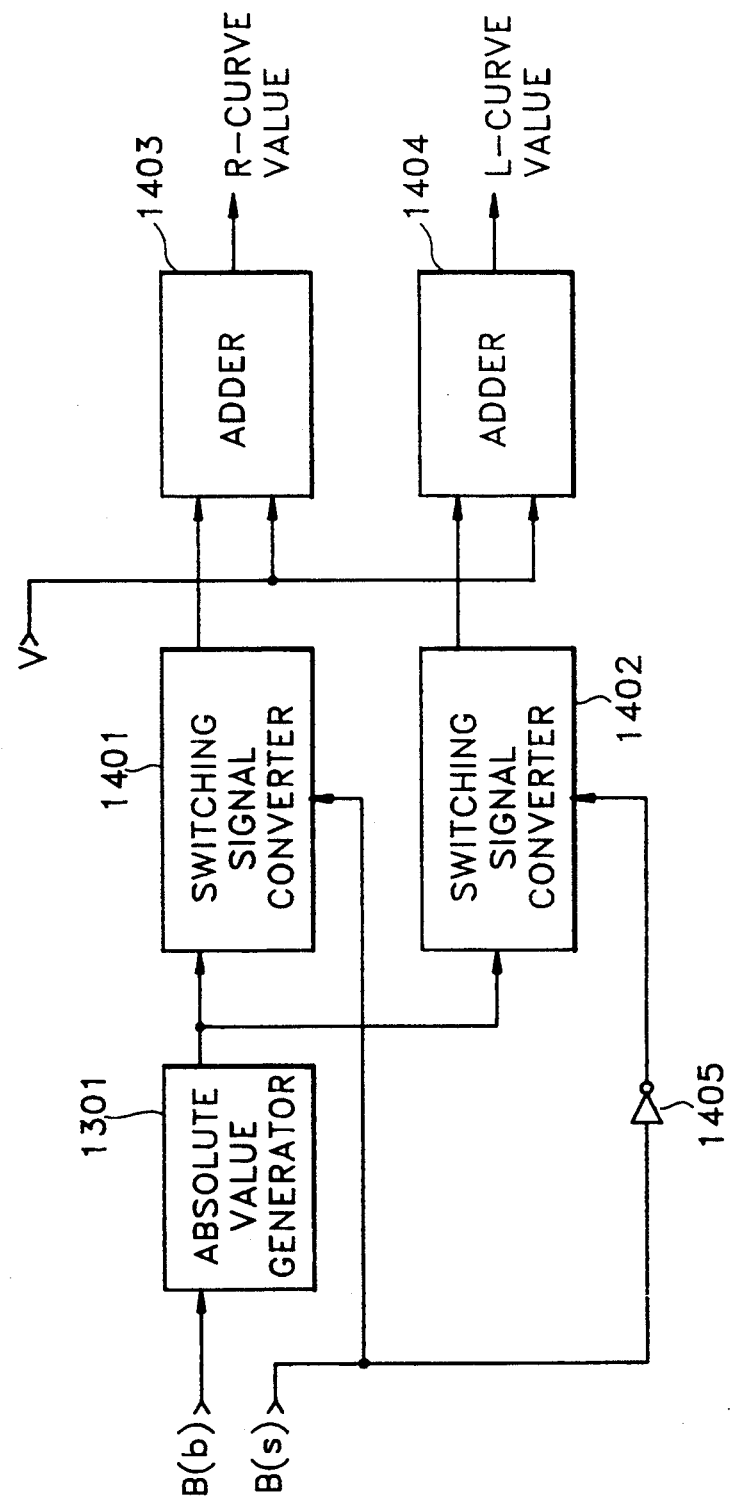
FIG. 14 is a block diagram of another embodiment of the curve value generator shown in FIG. 10 and FIG. 11.

FIG. 14 is a block diagram of another embodiment of the curve generator shown in FIG. 10 and FIG. 11. The curve generator includes an absolute value generator 1301, two switching sign converters 1401 and 1402, two adders 1403 and 1404, and an inverter 1405.

Referring to FIG. 14, Absolute value generator 1301 performs the same function as in FIG. 13. Here, switching sign converter 1401 converts the output of absolute value generator 1301 into the negative value thereof according to the direction signal S, and inverter 1405 inverts the direction signal S. Switching sign converter 1402 converts the output of absolute value generator 1301 into the negative value thereof, according to the output of inverter 1405. Adder 1403 adds the output of switching sign converter 1401 to the volume signal V, and adder 1404 adds the output of switching sign converter 1402 to the volume signal V.

Figure 15:
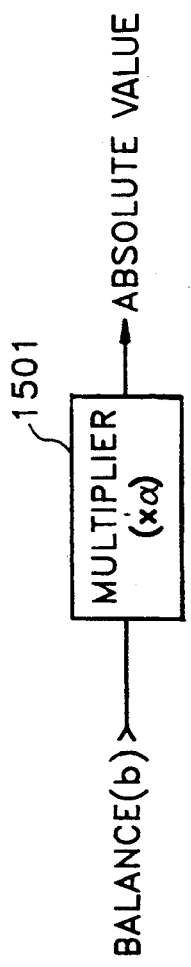
FIG. 15 is a block diagram of an embodiment of the absolute value generator shown in FIG. 13 and FIG. 14, and more particularly, an absolute value generator which generates the absolute values of the graph shown in FIG. 4.

FIG. 15 is a block diagram of an embodiment of the absolute value generator shown in FIGS. 13 and 14. FIG. 15 specifically shows the absolute value generator which generates the values shown in FIG. 4. The absolute generator includes a multiplier 1501 that multiplies the balance deviation signal b by the predetermined coefficient α which represents either slope in the graph of FIG. 4.

Figure 16:
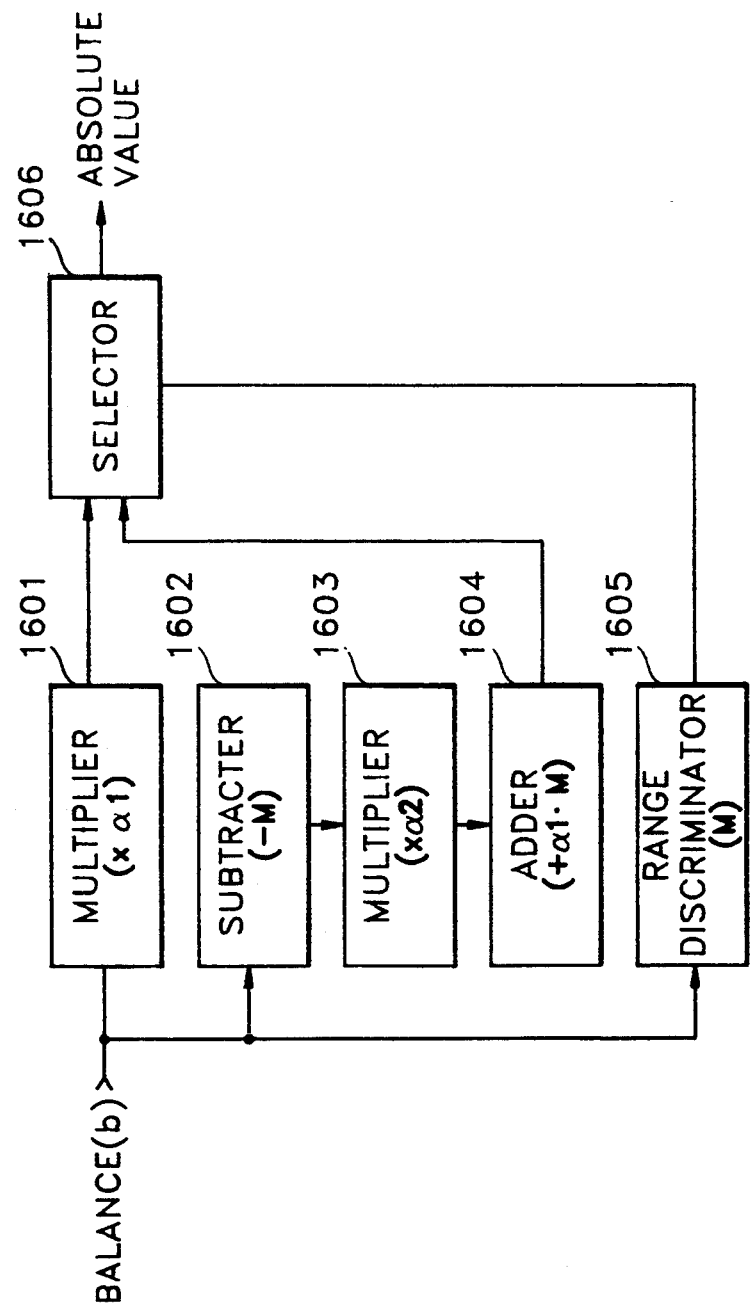
FIG. 16 is a block diagram of another embodiment of the absolute value generator shown in FIG. 13 and FIG. 14, and more particularly, an absolute value generator which generates the absolute values of the graph shown in FIG. 7.

FIG. 16 is a block diagram of another embodiment of the absolute value generator shown in FIG. 13 and FIG. 14. Specifically, FIG. 16 shows the absolute value generator which generates the absolute values shown in FIG. 7, and comprises two multipliers 1601 and 1603, a subtracter 1602, an adder 1604, a range discriminator 1605, and a selector 1606.

In FIG. 16, multiplier 1601 multiplies the balance deviation signal b by the first coefficient α1, and subtracter 1602 subtracts the boundary value M from the balance deviation signal b. Multiplier 1603 multiplies the output of multiplier 1602 by the second coefficient α2. The adder 1604 adds the output of multiplier 1602 to a predetermined constant α1·M. Range discriminator 1605 produces a signal indicating whether the balance deviation signal b is below the range value M. Selector 1606 selects one between the outputs of multiplier 1601 and adder 1604, according to the output of range discriminator 1605, and then outputs the selected result as an absolute value A.

Figure 17:
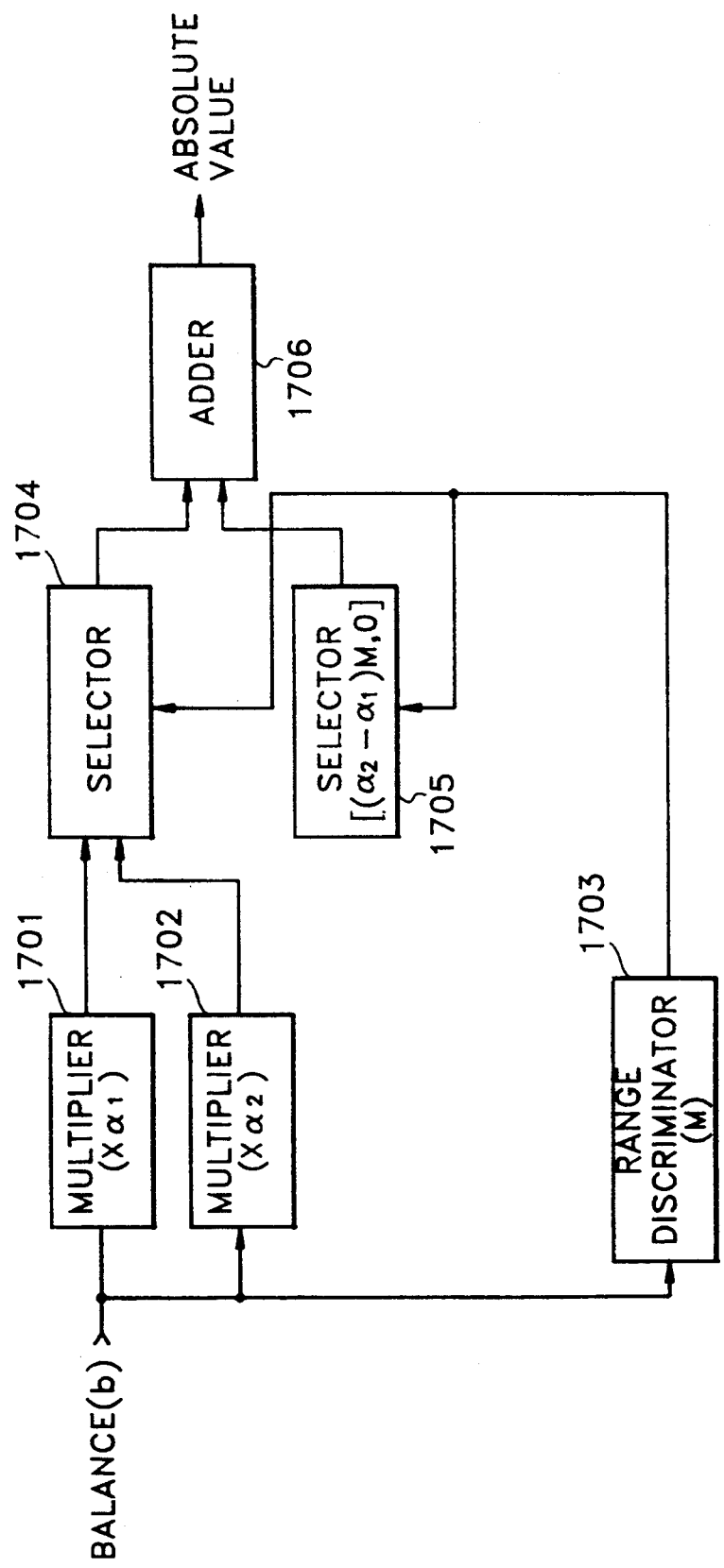
FIG. 17 is a block diagram of another embodiment of the absolute value generator shown in FIG. 13 and FIG. 14, and more particularly, an absolute value generator which generates the absolute values of the graph shown in FIG. 7.

FIG. 17 is a block diagram of another embodiment of the absolute value generator shown in FIG. 13 and FIG. 14, and specifically shows an absolute value generator which generates the values shown in FIG. 7.

In FIG. 17, the absolute value generator 1301 includes two multipliers 1701 and 1702, two selectors 1704 and 1705, a range discriminator 1703, and an adder 1706. Multiplier 1701 multiplies the balance deviation signal b by the first coefficient α1, and multiplier 1702 multiplies the balance deviation signal b by the second coefficient α2. Range discriminator 1703 outputs the signal which discriminates whether the balance deviation signal b is below the boundary value M, in the same way as in FIG. 16.

Selector 1704 selects between the outputs of multipliers 1701 and 1702 while selector 1705 selects between zero and a predetermined constant value $(\alpha 2-\alpha 1)M$, each according to the output of range discriminator 1703. Thus, the selected signals are provided to adder 1706, where they are added to produce an absolute value A.

Figure 18:
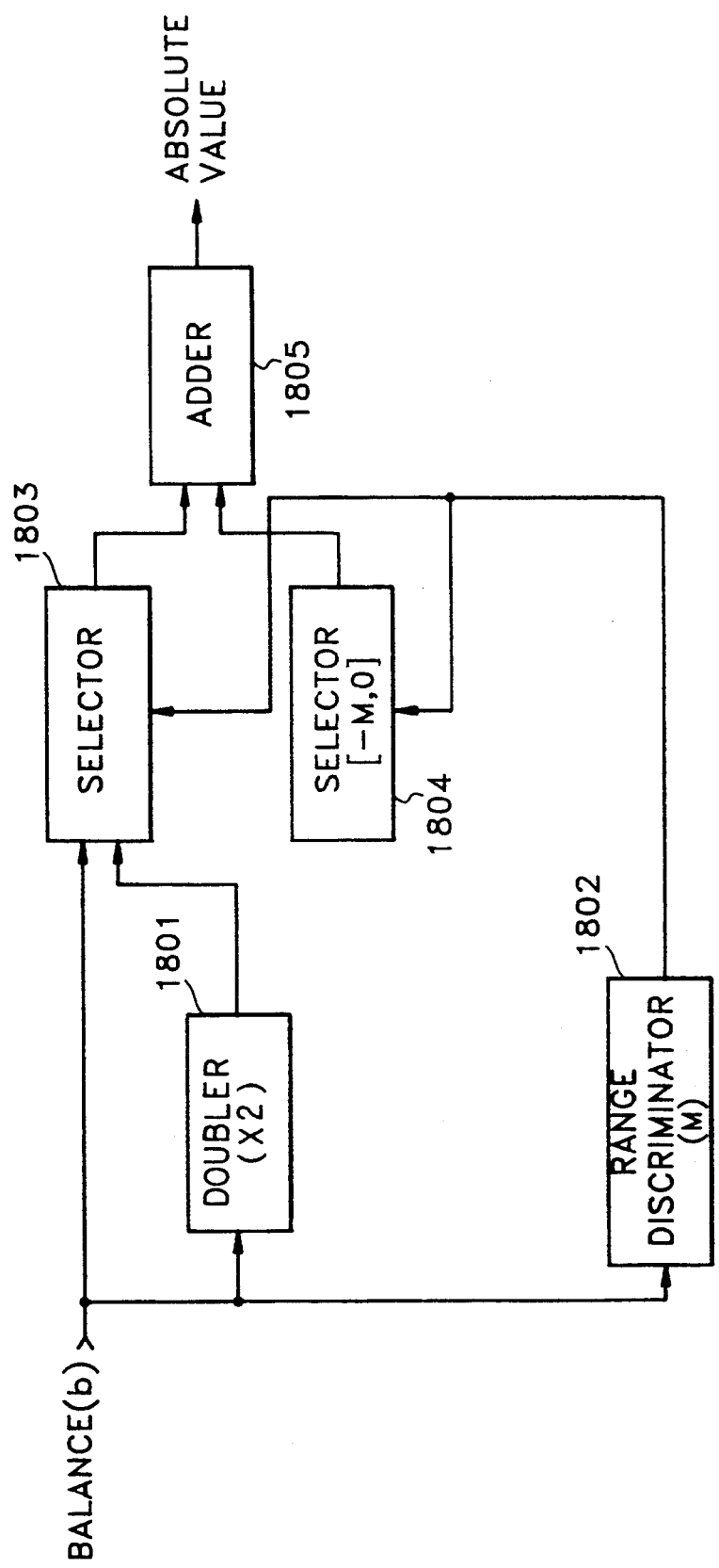
FIG. 18 is a block diagram of a modified absolute value generator corresponding to that shown in FIG. 17, wherein the first coefficient $\alpha 1$ is "1" and the second coefficient $\alpha 2$ is "2."

FIG. 18 is a block diagram of a modified absolute value generator corresponding to that shown in FIG. 17, and specifically shows an absolute value generator in which the first coefficient α1 is "1", and the second coefficient α2 is "2."

In FIG. 18, the absolute value generator includes a doubler 1801, a range discriminator 1802, two selectors 1803 and 1804 and an adder 1805. Doubler 1801 produces the doubled balance deviation signal b, and as mentioned above, this can be realized by using the multiplier or by connecting the signal line so as to be applied to selector 1803, up-shifting by one bit. As explained in FIG. 16, range discriminator 1802 outputs a signal which shows whether the balance deviation signal b is below the boundary value M. Selector 1803 selects one between the balance deviation signal b and the output of doubler 1801, according to the output of range discriminator 1802. Selector 1804 selects one between a zero value and predetermined constant value −M, according to the output of range discriminator 1802. Adder 1805 adds the outputs of selector 1803 and 1804 to produce an absolute value A.

Figure 19:
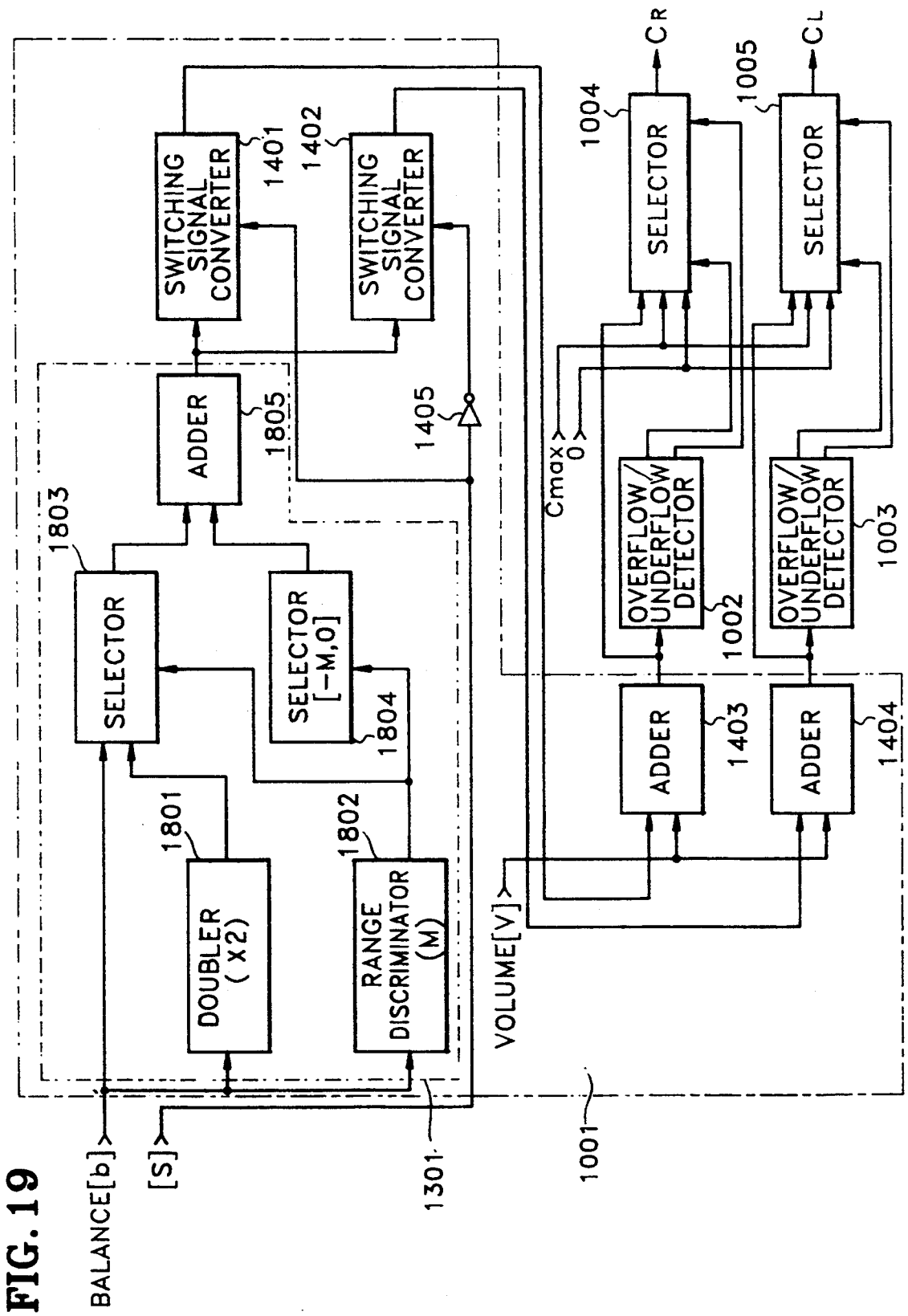
FIG. 19 is a detailed block diagram of the operation signal synthesizer, which incorporates block diagrams of FIGS. 10, 14 and 18 therein.

FIG. 19 is a block diagram of the operation signal synthesizer in which FIG. 10, FIG. 14 and FIG. 18 are linked together, provided that first coefficient α1 is "1" and second coefficient α2 is "2."

Figure 20:
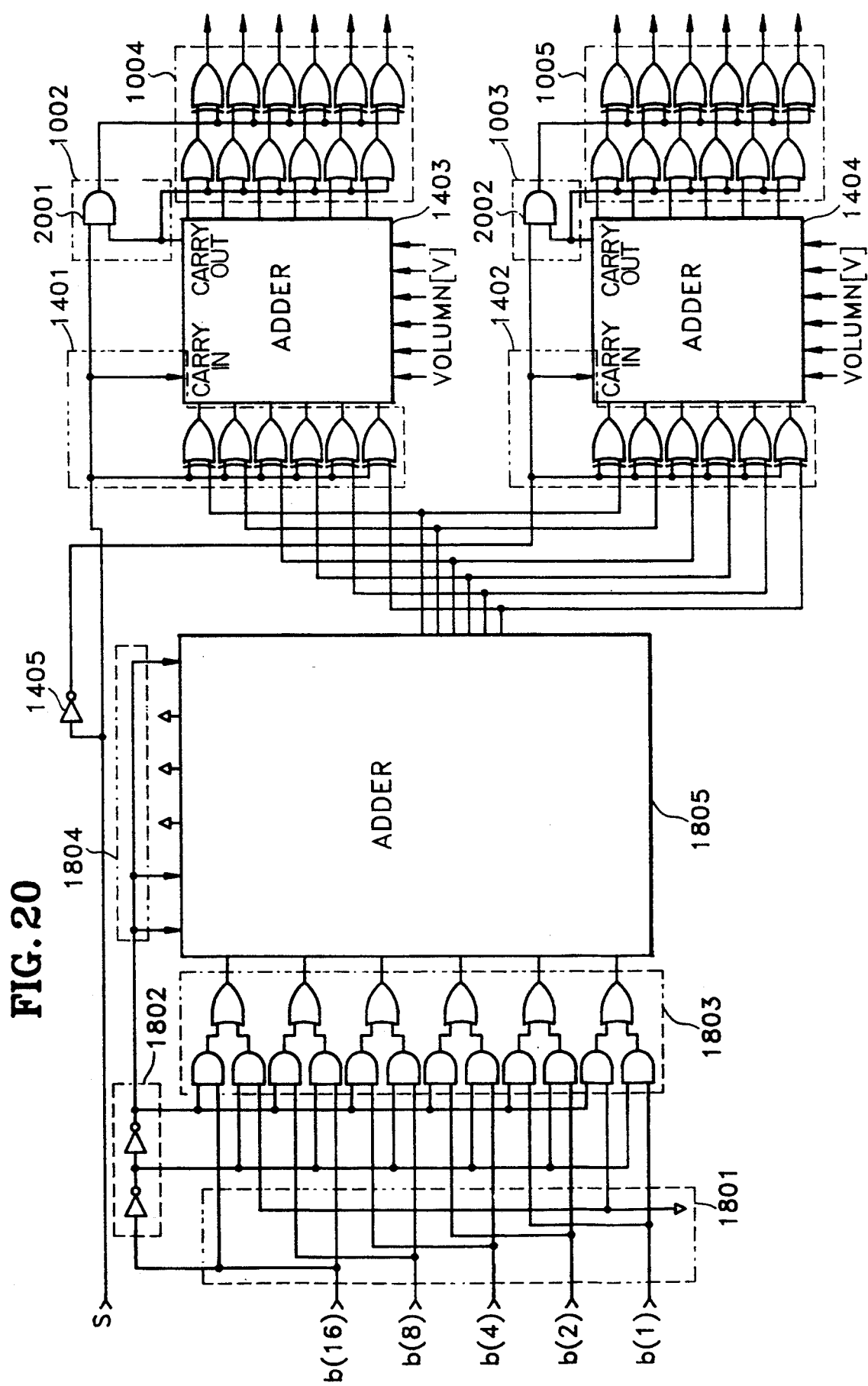
FIG. 20 is a circuit diagram of the operation signal synthesizer in FIG. 19.

FIG. 20 is a circuit diagram of the operation signal synthesizer shown in FIG. 19, which uses the same reference numerals as FIG. 19 in order to show how the operation signal is realized in each circuit. Specifically, the boundary value M in FIG. 20 is 15, and the maximum value Cmax of the synthesized control signal is 63, while the minimum value Cmin is zero.

In FIG. 20, doubler 1801 comprises connected lines which up-shift the balance deviation signal b by one bit and correspond "0" to the least significant bit. Range discriminator 1802 comprises two inverters and only discriminates whether the highest bit of the balance deviation signal b is "0" or "1." The selector 1803 is constituted by first and second AND gates and one OR gate for each bit. One bit of the output of doubler 1801 and the positive output of range discriminator 1802 is applied to each first AND gate, while one bit of the balance deviation signal b and the negative output of range discriminator 1802 is applied to each second AND gate. Additionally, the outputs of the first and second AND gates are applied to each OR gate. Accordingly, if the balance deviation signal is less than or equal to fifteen, the balance deviation signal is applied to the input of adder 1805 without no change, otherwise the balance deviation signal is converted to the doubled balance deviation signal to applied to the input of adder 1805. Meanwhile, selector 1804 selects "110001" if the positive output of range discriminator 1802 is "1," and selects "000000" if the positive output of range discriminator 1802 is "0." Here, "110001" is the two's complement expression of −M that is "−15." Overflow/underflow detector 1002 includes AND gate 2001 for receiving a carry output from adder 1403 and the direction signal S, and overflow/underflow detector 1003 includes AND gate 2002 for receiving a carry output from adder 1404 and the inverted direction signal S supplied from inverter 1405. That is, a carry generated in adders 1402 or 1403 means an underflow or all overflow exists.

If the direction signal S is "0" (meaning that the R-channel increases) and the carry generated from adder 1403 is "1", it is determined that overflow is generated in the R-channel curve value. While, if the direction signal S is "1" (meaning that the R-channel decreases), and the carry generated from adder 1403 is "1", it is determined that underflow is generated in the R-channel curve value.

On the other hand, if the direction signal S is "0," and the carry generated from adder 1404 is "1", it is judged that underflow is generated in the L-channel curve value. While, if the direction signal S is "1", and the carry generated from adder 1404 is "1", it is determined that overflow is generated in the L-channel curve value.

Also, if the carry generated from adders 1403 and 1404 are both "0", this means that neither overflow nor underflow is generated.

Each of selectors 1004 and 1005 includes a plurality of OR gates and a plurality of EXCLUSIVE-OR gates. The OR gates of each selector produces "111111", provided that the carry generated from each adder 1403, 1404 is being "1". The OR gates of each selector transfer the output of each adder without no change, provided that the carry generated from each adder 1403, 1404 is "0". Here, "111111" is the maximum value (i.e., Cmax or 63) allowed for the synthesized control signal.

In selectors 1004 and 1005, the EXCLUSIVE-OR gates invert the output of the OR gates in accordance with the output of the AND gates 2001 and 2002, respectively. Here, the output of either AND gate (2001 or 2002) becomes "1" only when underflow is generated, and as a result, the EXCLUSIVE-OR gates produces "000000" (that is the minimum value Cmin) when underflow exists.

As described above, the present invention improves the noise characteristics of the signal by including only one resistance array on the signal path and, simultaneously, enables independent operation of the volume or balance, to thereby enhance user convenience.

Additionally, the apparatus of the present invention has an advantage of decreasing the number of resistors in the resistance arrays, so that the occupied chip area of the resistors is smaller than that of the resistors of the conventional apparatus where the resistance arrays are realized in semiconductor device. Also, the operation signal synthesizer of the present invention can be the logic circuit, and as a result, most of the volumn/balance control apparatus, exclusive of operators, can be realized by single-chip.

It should be understood that although preferred embodiments of the invention have been described in detail above, many modifications and variations could be effected therein by one with ordinary skill in the art without departing from the spirit and scope of the invention as defined by the appended claims.

What is claimed is:

1. A volume/balance control apparatus for controlling volume and balance signals of a plurality of channels, comprising:
    a plurality of resistance arrays including at least an L-channel and an R-channel array, each of said arrays receiving the signals of one of said channels, and each having a plurality of resistors connected in series and a plurality of selectively activated switching elements connected in parallel across respective ones of said resistors;
    a balance operating means for producing a balance signal in accordance with a user's operation thereof;
    a volume operating means for producing a volume signal in accordance with a user's operation thereof;
    an operation signal synthesizing means for receiving said balance signal and said volume signal and for producing a plurality of synthesized control signals based on a predetermined relationship between said balance and volume signals, said synthesizing means including a first curve value generating means for producing an L-channel curve $C_{L'}$ and an R-channel curve $C_{R'}$ which satisfy the equations $$C_{R'} = \alpha \cdot B + V$$

and $$C_{L'} = -\alpha \cdot B + V$$

wherein B is a magnitude of the balance signal, V is a magnitude of the volume signal, and $\alpha$ is a predetermined coefficient; and
    a plurality of decoding means for decoding said plurality of synthesized control signals to derive respective decoded signals, and for applying the decoded signals to said switching elements included in each resistance array.

2. A volume/balance control apparatus as claimed in claim 1, wherein said operational signal synthesizing means further comprises:
    a first overflow/underflow detecting means for generating an output signal as a function of whether overflow or underflow of said R-channel curve value exists;
    a first selecting means for selecting one value among a predetermined maximum value, a predetermined minimum value and said R-channel curve value and based on the output signal of said first overflow/underflow detecting means;
    a second overflow/underflow detecting means for generating an output signal as a function of whether overflow or underflow of said L-channel curve value exists; and
    a second selecting means for selecting one value among the predetermined maximum value, the predetermined minimum value and said L-channel curve value based on the output signal of said second overflow/underflow detecting means.

3. A volume/balance control apparatus as claimed in claim 2, wherein said operation signal synthesizing means further comprises:
    a first doubling means for doubling said volume signal and outputting a signal in response thereto;
    a first subtracting means for subtracting a predetermined maximum value from the output of said first doubling means and outputting a signal in response thereto;
    a third selecting means for selecting one value among a predetermined maximum value, a predetermined minimum value, the output of said first subtracting means, the output of said first doubling means, and said R-channel curve value, in accordance with the output of said first overflow/underflow detecting means and the output of said second overflow/underflow detecting means; and
    a fourth selecting means for selecting one value among a predetermined maximum value, a predetermined minimum value, the output of said first subtracting means, the output of said first doubling means, and said L-channel curve value, in accordance with the output of said second overflow/underflow detecting means and the output of said first overflow/underflow detecting means.

4. A volume/balance control apparatus as claimed in claim 3, wherein said balance signal comprises a direction signal and a balance deviation signal, and wherein said first curve value generating means comprises:
    a first absolute value generating means for producing an absolute value according to the equation:

$$A = \alpha \cdot b$$

wherein A represents the absolute value and b represents said balance deviation signal;
    a first adding means for adding the absolute value produced by said first absolute value generating means to said volume signal;
    a second doubling means for doubling said volume signal and generating an output in response thereto;
    a second subtracting means for subtracting said output of the first adding means from the output of said second doubling means;
    a first inverter for inverting said direction signal;

a fifth selecting means for selecting one of the output of said first adding means and the output of said second subtracting means as a function of said direction signal; and a sixth selecting means for selecting one of the output of said first adding means and the output of said second subtracting means as a function of the output of said first inverting means.

5. A volume/balance control apparatus as claimed in claim 4 wherein said balance signal comprises a direction signal and a balance deviation signal, wherein said first curve value generating means comprises:

a first absolute value generating means for producing an absolute value in accordance with the following:

$$A = a \cdot b$$

wherein $a$ represents a predetermined coefficient, A represents the absolute value and b represents said balance deviation signal;

a first switching sign converting means for converting said absolute value into the negative value thereof according to said direction signal;

a second inverting means for inverting said directional signal;

a second switching sign converting means for converting said absolute value into the negative value thereof according to the output of said second inverting means;

a second adding means for adding the output of said first switching sign converting means to said volume signal; and a third adding means for adding the output of said second switching sign converting means to said volume signal.

6. A volume/balance control apparatus as claimed in claim 1, wherein said operation signal synthesizing means comprises a second curve value generating means for receiving said balance signal and said volume signal and producing an L-channel curve value and an R-channel curve value according to a relationship between the volume and the balance which is selected among a plurality of predetermined relationships in accordance with the range of said balance signal.

7. A volume/balance control apparatus as claimed in claim 6, wherein said second curve value generating means produces said L-channel curve value $C_L$ and said R-channel curve value $C_R$, in accordance with the relationships:

$$if -M \leq M, C_{R'} = \alpha 1 \cdot B + V \text{ and } C_{L'} = -\alpha 1 \cdot B + V \quad \text{i)}$$

$$if B > M \text{ or } B < -M, C_{R'} = \alpha 2 \cdot (B-M) + \alpha 1 \cdot M + V \text{ and}$$
$$C_{L'} = -\alpha 2 \cdot (B-M) - \alpha 1 \cdot M + V \quad \text{ii)}$$

wherein $\alpha 1$ and $\alpha 2$ are a predetermined first coefficient and a second coefficient, respectively, M is a predetermined boundary value and B represents said balance signal.

8. A volume/balance control apparatus as claimed in claim 7, wherein said operation signal synthesizing means further comprises:

a third overflow/underflow detecting means for detecting whether overflow or underflow of the R-channel curve value $C_{R'}$ exists;

a seventh selecting means for selecting one value among a predetermined maximum value, a predetermined minimum value and said R-channel curve value in accordance with the output of said third overflow/underflow detecting means;

a fourth overflow/underflow detecting means for detecting whether overflow or underflow of said L-channel curve value exists; and an eighth selecting means for selecting one value among a predetermined maximum value, a predetermined minimum value and said L-channel curve value in accordance with the output of said fourth overflow/underflow detecting means.

9. A volume/balance control apparatus as claimed in claim 7, wherein said operational signal synthesizing means further comprises:

a third doubling means for doubling said volume signal;

a third subtracting means for subtracting a predetermined maximum value from the output of said third doubling means;

a third overflow/underflow detecting means for detecting whether overflow or underflow of said R-channel curve value exists;

a fourth overflow/underflow detecting means for detecting whether overflow or underflow of said L-channel curve value exist;

a ninth selecting means for selecting one value among a predetermined maximum value, a predetermined minimum value, the output or said third subtracting means, the output of said third doubling means, and the R-channel curve value in accordance with the output of said third overflow/underflow detecting means and the output of said fourth overflow/underflow detecting means; and a tenth selecting means for selecting one value among a predetermined maximum value, a predetermined minimum value, the output of said third subtracting means, the output of said third doubling means, and the L-channel curve value, in accordance with the output of said fourth overflow/underflow detecting means and the output of said third overflow/underflow detecting means.

10. A volume/balance control apparatus as claimed in claim 7, wherein said balance signal comprises a direction signal and a balance deviation signal, wherein aid second curve value generating means comprises:

a second absolute value generating means for receiving said balance deviation signal and producing an absolute value according to the equation:

$$A = \alpha 2 \cdot (b-M) + \alpha 1 \cdot M$$

wherein $\alpha 1$ and $\alpha 2$ are first and second predetermined coefficients, respectively, A represents the absolute value, b represents the balance signal and M is a predetermined border value;

a fourth adding means for adding the output of said second absolute value generating means to said volume signal;

a third doubling means for doubling said volume signal;

a fourth subtracting means for subtracting the output of said fourth adding means from the output of said third doubling means;

a third inverting means for inverting said direction signal;

an eleventh selecting means for selecting one between the output of said fourth adding means and the output of said fourth subtracting means according to said direction signal; and a twelfth selecting means for selecting one between the output of said fourth adding means and output of said fourth subtracting means according to the output of said third inverting means.

11. A volume/balance control apparatus as claimed in claim 7, wherein said balance signal comprises a direction signal and a balance deviation signal, wherein said second curve value generating means comprises:
a second absolute value generating means for receiving said balance deviation signal and producing an absolute value according to the equation:

$$A = \alpha 2 \cdot (b - M) + \alpha 1 \cdot M$$

wherein $\alpha 1$ and $\alpha 2$ are first and second predetermined coefficients, respectively, A represents the absolute value, b represents the balance deviation signal and M is a predetermined border value;
a third switching sign converting means for converting said absolute value into the negative value thereof in accordance with said direction signal;
a fourth inverting means for inverting said directional signal;
a fourth switching sign converting means for converting said absolute value into the negative value thereof in accordance with the output of said fourth inverting means;
a fifth adding means for adding the output of said third switching sign converting means to said volume signal; and
a sixth adding means for adding the output of said fourth switching signal converting means to said volume signal.

12. A volume/balance control apparatus as claimed in claim 11, wherein said second absolute value generating means comprises:
a first multiplying means for multiplying said balance deviation signal by said first coefficient;
a fifth subtracting means for subtracting said boundary value M from said balance deviation signal;
a second multiplying means for multiplying the output of said fifth subtracting means by said second coefficient $\alpha 2$;
a seventh adding means for adding the output of said second multiplying means to a constant value which is determined by multiplying said first coefficient $\alpha 1$ and said boundary value M;
a first range discriminating means for producing a signal which indicates whether said balance deviation signal is less than or equal to said boundary value M; and
a thirteenth selecting means for selecting one between the output of said first multiplying means and output of said seventh adding means in accordance with the output of said first range discriminating means.

13. A volume/balance control apparatus as claimed in claim 11, wherein said second absolute value generating means comprises:
a third multiplying means for multiplying said balance deviation signal by said first coefficient $\alpha 1$;
a fourth multiplying means for multiplying said balance deviation signal by said second coefficient $\alpha 2$;
a second range discriminating means for producing a signal which indicates whether said balance deviation signal is less than or equal to said boundary value;
a fourteenth selecting means for selecting one between the output of said third multiplying and the output of said fourth multiplying means in accordance with the output of said second range discriminating means;
a fifteenth selecting means for selecting one between "0" and a constant value which is determined by subtracting the first coefficient $\alpha 1$ from said second coefficient $\alpha 2$ and then multiplying the subtracted value by said boundary value, in accordance with the output of said second range discriminating means; and
an eighth adding means for adding the output of said fourteenth selecting means to the output of said fifteenth selecting means.

14. A volume/balance control apparatus as claimed in claim 6, wherein said second curve value generating means produces said L-channel curve value $C_{L'}$ and said R-channel curve value $C_{R'}$ according to the relationships:

$$\text{if} -M \geq B \geq M, C_{R'} = B + V \text{ and } C_{L'} = -B + V \quad \text{i)}$$

$$\text{if } B > M \text{ or } B < -M, C_{R'} = 2B + M + V \text{ and}$$
$$C_{L1} = -2B - M + V \quad \text{ii)}$$

wherein M is a predetermined boundary value and B represents said balance signal.

15. A volume/balance control apparatus as claimed in claim 14, wherein said operation signal synthesizing means further comprises:
a fifth overflow/underflow detecting means for detecting whether overflow or underflow of the R-channel curve value exists;
a sixteenth selecting means for selecting one value among a predetermined maximum value, a predetermined minimum value and said R-channel curve value, in accordance with the output of said fifth overflow/underflow detecting means;
a sixth overflow/underflow detecting means for detecting whether overflow or underflow of the L-channel curve value exists; and
a seventeenth selecting means for selecting one value among a predetermined maximum value, a predetermined minimum value and said L-channel curve value, in accordance with the output of said sixth overflow/underflow detecting means.

16. A volume/balance control apparatus as claimed in claim 15, provided that said balance signal comprises a direction signal and a balance deviation signal, wherein said second curve value generating means comprises:
a third absolute value generating means for receiving said balance deviation signal and producing an absolute value according to the equation $$A = 2b - M$$

wherein A represents the absolute value, b represents said balance signal, and M is a predetermined boundary value;
a fifth switching sign converting means for converting said absolute value into the negative value thereof in accordance with said direction signal;
a fifth inverting means for inverting said directional signal;
a sixth switching sign converting means for converting said absolute value into the negative value thereof in accordance with the output of said fifth inverting means;

a ninth adding means for adding the output of said fifth switching sign converting means to said volume signal; and a tenth adding means for adding the output of said sixth switching sign converting means to said volume signal.

17. A volume/balance control apparatus as claimed in claim 16, wherein said fifth switching sign converting means comprises a first switching inverting means for inverting the output of said third absolute value generating means in accordance with said direction signal, said fifth switching sign converting means applying said direction signal to said ninth adding means as an input carry.

18. A volume/balance control apparatus as claimed in claim 17, wherein said first switching inverting means comprises a first plurality of EXCLUSIVE-OR gates for receiving one bit among the outputs of said third absolute value generating means and said direction signal, respectively.

19. A volume/balance control apparatus as claimed in claim 16, wherein said sixth switching sign converting means comprises a second switching inverting means for inverting the output of said third absolute value generating means in accordance with the output of said fifth inverting means, and applying the output of said fifth inverting means to said tenth adding means as an input carry.

20. A volume/balance control apparatus as claimed in claim 19, wherein said second switching inverting means comprises a second EXCLUSIVE-OR gates for receiving one bit among the outputs of said third absolute value generating means and the output or said fifth inverting means, respectively.

21. A volume/balance control apparatus as claimed in claim 16, wherein said third absolute value generating means comprises:
  a fourth doubling means for doubling said balance deviation signal;
  a third range discriminating means for producing a signal which indicates whether said balance deviation signal is less than or equal to said boundary value;
  a eighteenth selecting means for selecting one between said balance deviation signal and the output of said fourth doubling means in accordance with the output of said third range discriminating means;
  a nineteenth selecting means for selecting one between "0" and the negative value of the said boundary value; and a eleventh adding means for adding the output of said eighteenth selecting means to the output of said nineteenth selecting means.

22. A volume/balance control apparatus as claimed in claim 21, wherein said fourth doubling means is for up-shifting said balance deviation signal by one bit and substituting "0" to the least significant bit thereof.

23. A volume/balance control apparatus as claimed in claim 21, wherein said eighteenth selecting means comprises:
  a first plurality of AND gates for receiving one bit of the output of said fourth doubling means and the output of said third range discriminating means, respectively;
  a second plurality of AND gates for receiving one bit of said balance deviation signal and the inverted signal of the output of said third range discriminating means, respectively; and
  a first plurality of OR gates for receiving the output of first AND gate and the output of second AND gate, respectively.

24. A volume/balance control apparatus as claimed in claim 16, wherein said fifth overflow/underflow detecting means comprises a third AND gate for receiving said direction signal and the carry which is produced from said ninth adding means.

25. A volume/balance control apparatus as claimed in claim 16, wherein said sixth overflow/underflow detecting means comprises a fourth AND gate for receiving the output of said fifth inverting means and the carry which is produced output from said tenth adding means.

26. A volume/balance control apparatus as claimed in claim 16, wherein said sixteenth selecting means comprises:
  a second plurality of OR gates for receiving one bit of the output of said ninth adding means and the carry which is produced from said ninth adding means, respectively; and
  a third plurality of EXCLUSIVE-OR gates for receiving the output of said OR gate and the output of said fifth overflow/underflow detecting means, respectively.

27. A volume/balance control apparatus as claimed in claim 16, wherein said seventeenth selecting means comprises:
  a third plurality of OR gates for receiving one bit of the output of said tenth adding means and the carry which is produced from said tenth adding means, respectively; and
  a fourth plurality of EXCLUSIVE-OR gates for receiving the output of said third OR gate and the output of said sixth overflow/underflow detecting means, respectively.

* * * * *